United States Patent
Lee

(10) Patent No.: US 7,442,320 B2
(45) Date of Patent: Oct. 28, 2008

(54) NANOSTRUCTURED MATERIALS AND PHOTOVOLTAIC DEVICES INCLUDING NANOSTRUCTURED MATERIALS

(75) Inventor: Howard W. H. Lee, Saratoga, CA (US)

(73) Assignee: UltraDots, Inc., Menlo Park, CA (US)

(*) Notice: Subject to any disclaimer, the term of this patent is extended or adjusted under 35 U.S.C. 154(b) by 214 days.

(21) Appl. No.: 11/156,233

(22) Filed: Jun. 16, 2005

(65) Prior Publication Data
US 2007/0006914 A1 Jan. 11, 2007

Related U.S. Application Data

(60) Provisional application No. 60/580,816, filed on Jun. 18, 2004.

(51) Int. Cl.
H01L 29/12 (2006.01)
H01L 31/00 (2006.01)

(52) U.S. Cl. .......... 252/62.3 E; 136/256; 136/261

(58) Field of Classification Search ......... 136/243–265; 252/62.3 V, 62.3 E, 62.3
See application file for complete search history.

(56) References Cited

U.S. PATENT DOCUMENTS

| | | | |
|---|---|---|---|
| 5,571,612 A * | 11/1996 | Motohiro et al. ............ | 428/323 |
| 6,710,366 B1 | 3/2004 | Lee et al. | |
| 6,794,265 B2 | 9/2004 | Lee et al. | |
| 6,819,845 B2 | 11/2004 | Lee et al. | |
| 6,878,871 B2 * | 4/2005 | Scher et al. ................. | 132/252 |
| 2003/0066998 A1 | 4/2003 | Lee | |
| 2004/0036130 A1 | 2/2004 | Lee et al. | |

FOREIGN PATENT DOCUMENTS

WO  WO 2004023527 A2 * 3/2004

OTHER PUBLICATIONS

Lin, T.-C. et al, "Silicon-germanium spherical quantum dot infrared photodetectors prepared by the combination of bottom-up and top-down technologies". J.Vac.Sci.Technol.B 22(1), 109-115. (2004).*
Lin, C.-W. et al, "Structural and optical properties of silicon-germanium alloy nanparticles". J.Appl.Phys. 91(4) 2322-2325. (2002).*

(Continued)

*Primary Examiner*—Patrick Ryan
*Assistant Examiner*—Jeffrey T. Barton
(74) *Attorney, Agent, or Firm*—Cooley Godward Kronish LLP

(57) ABSTRACT

Nanostructured materials and photovoltaic devices including nanostructured materials are described. In one embodiment, a nanostructured material includes: (a) a first nano-network formed from a first set of nanoparticles; and (b) a second nano-network coupled to the first nano-network and formed from a second set of nanoparticles. At least one of the first set of nanoparticles and the second set of nanoparticles are formed from an indirect bandgap material. The nanostructured material is configured to absorb light to produce a first type of charge carrier that is transported in the first nano-network and a second type of charge carrier that is transported in the second nano-network. The nanostructured material has an absorption coefficient that is at least $10^3$ cm$^{-1}$ within a range of wavelengths from about 400 nm to about 700 nm.

13 Claims, 9 Drawing Sheets

OTHER PUBLICATIONS

U.S. Appl. No. 10/212,002, filed Aug. 2, 2002, Lee et al.

S.G. Bailey et al., "Nanostructured Materials for Solar Cells," *3rd World Conference on Photovoltaic Energy Conversion*, May 12-16, 2003, Osaka, Japan, SIP-A7-02, May 12-16, 2003.

T. Baron et al., "Chemical Vapor Deposition of Ge Nanocrystals on $SiO_2$," *Applied Physics Letters*, vol. 83:7, Aug. 18, 2003.

M.R. Bauer et al., "SnGe Superstructure Materials for Si-Based Infrared Optoelectronics," *Applied Physics Letters*, vol. 83:17, Oct. 27, 2003.

B. Bitnar et al., "New Flexible Photocell Module for Thermophotovoltaic Applications," *Paul Scherer Institute*, CH-5232 Villigen, PSI, Switzerland. (Date Not Indicated).

B. Burnett, "The Basic Physics and Design of III-V Multijunction Solar Cells," NREL III-V Research Group, 2002.

S.F. Chen et al. "Low Temperature Grown Poly-SiGe Thin Film by Au Metal-Induced Lateral Crystallisation (MILC) With Fast MILC Growth Rate," *Electronics Letters*, vol. 39:22, Oct. 30, 2003.

K.M. Coakley et al., "Infiltrating Semiconducting Polymers Into Self-Assembled Mesoporous Titania Films for Photovoltaic Applications," *Adv. Funct. Mater.*, vol. 13:4, Apr. 2003.

G. Domenico et al., "Si Nanocrystals Obtained Through Polymer Pyrolysis," *Applied Physics Letters*, vol. 83:4, Jul. 28, 2003.

O. Englander et al., "Local Synthesis of Silicon Nanowires and Carbon Nanotubes on Microbridges," *Applied Physics Letters*, vol. 82:26, Jun. 30, 2003.

V.L. Dalal et al., "Microcrystalline Germanium Carbide—A New Material for PV Conversion," *Iowa State University, Dept. of Electrical and Computer Engr., Ames, Iowa 50011*. (Date Not Indicated).

V.L. Dalal et al., "Growth and Properties of Microcrystalline Ge-C films and Devices," *NCPV and Solar Program Review Meeing 2003*, Iowa State University, Dept. of Electrical and Computer Engr., Ames, Iowa 50011.

Q. Fan et al., "An Investigation of GaSb/GaAs Thermophotovoltaic Cells," *University of Hull, Dept. of Engineering, Cottingham Road, Hull, HU6 7RX, U.K.; University of Oxford, Dept. of Physics, Parks Road, Oxford, OX1 3PU, U.K.; Key Centre of Photovoltaic Engineering, The University of New South Wales, Sydney, NSW 2052, Australia*. (Date Not Indicated).

L.M. Fraas et al., "Thermophotovoltaic Furnace-Generator for the Home Using Low Bandgap GaSb Cells," *Semicond. Sci. Technol.*, 18:S247-S253, 2003.

M. Gratzel, "Solar Cells to Dye For," *Nature*, vol. 421, Feb. 6, 2003.

B. Gregg, "Excitonic Solar Cells," *J. Phys. Chem B*, 107:4688-4698, 2003.

M. Green, "Photovoltaic principles," *Physica E*, 14:11-17, 2002.

S.A. Haque, et al., "Flexible Dye Sensitised Inorganic/Organic Nancomposite Solar Cells," *Centre for Electronic Materials and Devices, Department of Chemistry, Imperial College of Science Technology and Medicine*, London SW7 2AZ, U.K. (Date Not Indicated).

K. Hara, et al., "Dye-Sensitized Nanocrystalline $TiO_2$ Solar Cells Based on Novel Coumarin Dyes," *Solar Energy Materials and Solar Cells*, 77:89-103, 2003.

C. Hu et al., "Synethesis of Highly Coherent SiGe and $Si_4Ge$ Nanostructures by Molecular Beam Epitaxy of $H_3SIGeH_3$ and $GE(SiH_3)_4$," *Chemistry of Materials*, vol. 15:19, Sep. 23, 2003.

J. Li et al., "Shape Effects on Electronic States of Nanocrystals," *Nano Letters*, vol. 0:0 A-G, Revised Manuscript.

S.Y. Lin et al., "Three-Dimensional Photonic-Crystal Emitter For Thermal Photovoltaic Power Generation," *Applied Physics Letters*, vol. 83:2, Jul. 14, 2003.

M. Losurdo et al., "Dielectric Function of Nanocrystalline Silicon With Few Nanometers (<3nm) Grain Size," *Applied Physics Letters*, vol. 82:18, May 5, 2003.

J. Luther, "Photovoltaic Electricity Generation—Status and Perspectives," *Fraunhofer Institute for Solar Energy Systems, ISE, Freiburg*. (Date Not Indicated).

T. Martensson et al., "Fabrication of Individually Seeded Nanowire Arrays by Vapour-Liquid-Solid Growth," *Nanotechnology*, 14:1255-1258, 2003.

S. Nakade et al., "Electron Transport in Electrodes Consisting of Metal Oxide Nano-Particles Filled with Electrolyte Solution," *Physica E* 14:210-214, 2002.

A.J. Nozik, "Quantum Dot Solar Cells," *Physica E* 14:115-120, 2002.

G. Palfinger et al., "Cost Estimates of Electricity From A TPV Residential Heating System," *17th European Photovoltaic Solar Energy Conference and Exhibition*, Munich, Oct. 2001.

G. Palfinger et al., "Cost Estimates of Electricity From A TPV Residential Heating System," *Presented at the Fifth Conference on Thermophotovoltaic Generation of Electricity*, Rome, Italy, Sep. 15-19, 2002.

P. Peumans et al., "Efficient Bulk Heterojunction Photovoltaic Cells Using Small-Molecular-Weight Organic Thin Films," *Nature* vol. 425, Sep. 11, 2003.

A. Puzder et al., "Computational Studies of the Optical Emission of Silicon Nanocrystals," *J. Am. Chem. Soc.*, 125:2786-2791, 2003.

B. Rech et al., "Highly Efficient Silicon Thin Film Solar Cells With Advanced Light Trapping," *3rd World Conference on Photovoltaic Energy Conversion WCPEC-3*, Osaka, Japan, May 2003.

M.E. Rincon et al., "Thermal Treatment Effects in the Photovoltaic Conversion of Spray-Painted $TiO_2$ Coatings Sensitized By Chemically Deposited CdSe Thin Films," *Solar Energy Materials & Solar Cells*, 70:163-173, 2001.

Pcheyakov, O.P., et al., "Silicon-Germanium Nanostructures with Quantum Dots: Formation Mechanisms and Electrical Properties," *Semiconductors*, vol. 34, No. 11 (2000) pp. 1229-1247.

\* cited by examiner

Staggered Band Gap

Broken Gap

NANOSTRUCTURED MATERIALS AND PHOTOVOLTAIC DEVICES INCLUDING NANOSTRUCTURED MATERIALS

CROSS-REFERENCE TO RELATED APPLICATION

This application claims the benefit of U.S. Provisional Application Ser. No. 60/580,816, filed on Jun. 18, 2004, the disclosure of which is incorporated herein by reference in its entirety.

FIELD OF THE INVENTION

The invention relates generally to nanostructured materials. More particularly, the invention relates to nanostructured materials and photovoltaic devices including nanostructured materials.

BACKGROUND OF THE INVENTION

Photovoltaic devices can be used to produce electrical energy from light energy, such as from the sun or a thermal source. Current photovoltaic devices include p-n junction devices based on crystalline or amorphous semiconductor materials, heterojunction devices based on crystalline or amorphous semiconductor materials, metal/semiconductor Schottky heterojunction devices, and devices based on combinations of metals, semiconductor materials, and electrolytic solutions. During operation of a current photovoltaic device, light is absorbed by a photoactive material to produce charge carriers in the form of electron-hole pairs or excitons. Electrons exit the photoactive material through one electrode, while holes exit the photoactive material through another electrode. The net effect is a flow of an electric current through the photovoltaic device driven by incident light energy, which electric current can be delivered to an external load to perform useful work. The inability to convert the total incident light energy to useful electrical energy represents a loss or inefficiency of the photovoltaic device.

Current photovoltaic devices typically suffer a number of technical limitations on the ability to efficiently convert incident light energy to useful electrical energy. A significant loss mechanism of current photovoltaic devices typically derives from a mismatch between an incident light spectrum, such as a solar spectrum, and an absorption spectrum of the photovoltaic devices. Photons with energy greater than a bandgap energy or an energy gap of a photoactive material typically lead to the production of photoexcited electron-hole pairs with excess energy. Such excess energy is typically not converted to electrical energy but is rather typically lost as heat through hot charge carrier relaxation or thermalization. Photons with energy less than the bandgap energy of the photoactive material are typically not absorbed and, thus, typically do not contribute to the conversion to electrical energy. As a result, a small range of the incident light spectrum can be efficiently converted to useful electrical energy.

Also, in accordance with junction designs of current photovoltaic devices, charge separation of electron-hole pairs is typically confined to a region around a depletion zone, which can be limited in extent to, for example, a plane in a photoactive material. Electron-hole pairs that are produced further than a diffusion or drift length from the depletion zone typically do not charge separate and, thus, typically do not contribute to the conversion to electrical energy. As a result, most electron-hole pairs that are produced in the photoactive material typically do not contribute to an electric current.

Another loss mechanism of current photovoltaic devices typically derives from recombination of photoexcited electron-hole pairs. Recombination of photoexcited electron-hole pairs reduces the number of charge carriers contributing to an electric current, thus reducing the conversion efficiency. Current photovoltaic devices can sometimes exhibit an undesirable level of recombination of photoexcited electron-hole pairs as a result of short recombination times and the presence of defects, which can serve as recombination sites or trapping sites. Since current photovoltaic devices typically rely on minority charge carrier transport, strict fabrication conditions can be required to reduce the impact of charge carrier recombination.

A further loss mechanism of current photovoltaic devices typically derives from resistive loses, such as from series and parallel resistance. As charge carriers traverse a photoactive material, the charge carriers typically encounter electrical resistance, which leads to resistive loses. Further resistive losses can derive from electrical resistance at a depletion zone that separates photoexcited charge carriers and at a contact between electrodes and the photoactive material.

It is against this background that a need arose to develop the nanostructured materials and the photovoltaic devices described herein.

SUMMARY OF THE INVENTION

In one aspect, the invention relates to a nanostructured material. In one embodiment, the nanostructured material includes: (a) a first nano-network formed from a first set of nanoparticles; and (b) a second nano-network coupled to the first nano-network and formed from a second set of nanoparticles. At least one of the first set of nanoparticles and the second set of nanoparticles are formed from an indirect bandgap material. The nanostructured material is configured to absorb light to produce a first type of charge carrier that is transported in the first nano-network and a second type of charge carrier that is transported in the second nano-network. The nanostructured material has an absorption coefficient that is at least $10^3$ cm$^{-1}$ within a range of wavelengths from about 400 nm to about 700 nm.

In another embodiment, the nanostructured material includes: (a) a first nano-network including a set of Si nanoparticles that are at least one of fused and interconnected to provide transport of a first type of charge carrier; and (b) a second nano-network coupled to the first nano-network and including a set of Ge nanoparticles that are at least one of fused and interconnected to provide transport of a second type of charge carrier.

In another aspect, the invention relates to a photovoltaic device. In one embodiment, the photovoltaic device includes: (a) a first electrode; (b) a second electrode; and (c) a nanostructured material positioned between the first electrode and the second electrode. The nanostructured material is configured to absorb incident light to produce a first type of charge carrier that is transported to the first electrode and a second type of charge carrier that is transported to the second electrode. The nanostructured material includes a set of nanoparticles that are configured to provide a conductive path through at least a portion of the nanostructured material, and the set of nanoparticles are formed from an indirect bandgap material. The photovoltaic device provides a short circuit current density that is greater than 20 mA/cm$^2$ when the photovoltaic device is irradiated with the incident light.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of various embodiments of the invention, reference should be made to the following detailed description taken in conjunction with the accompanying drawings.

DETAILED DESCRIPTION

Definitions

Figure 1:
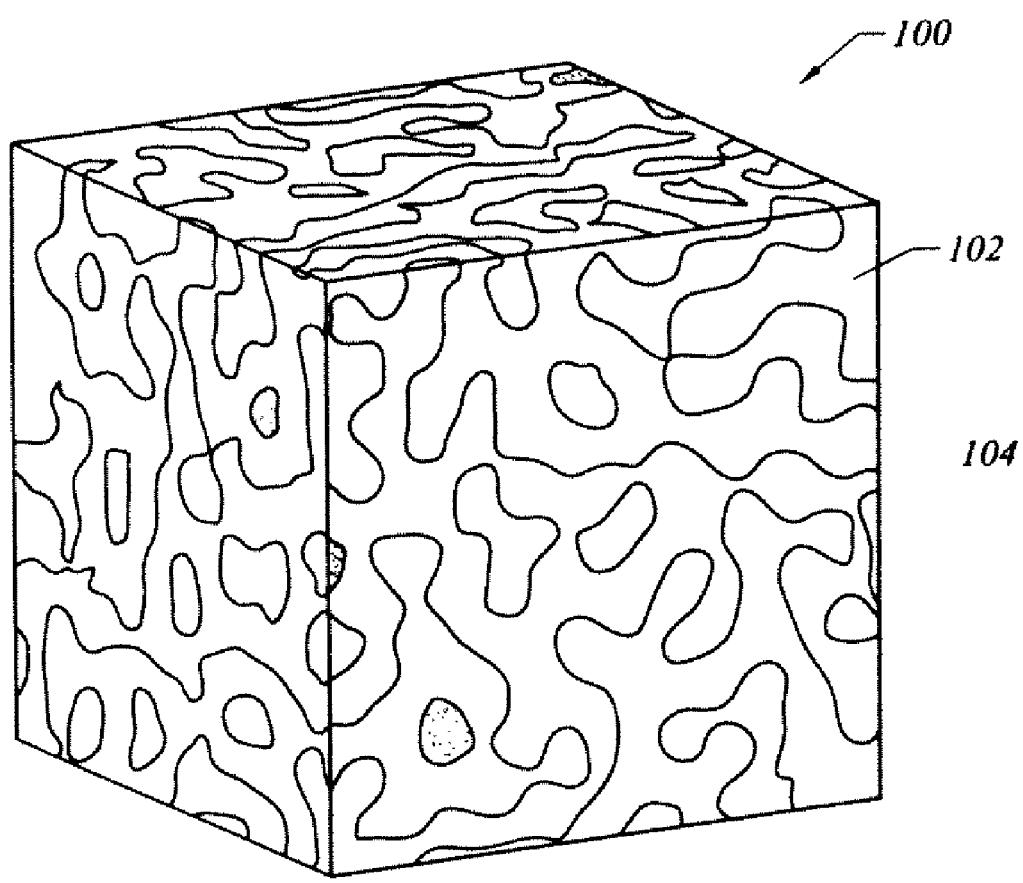
FIG. 1 illustrates a nanostructured material that includes two nano-networks interpenetrating one other, according to an embodiment of the invention.

The following definitions apply to some of the elements described with regard to some embodiments of the invention. These definitions may likewise be expanded upon herein.

As used herein, the term "set" refers to a collection of one or more elements. Elements of a set can also be referred to as members of the set. Elements of a set can be the same or different. In some instances, elements of a set can share one or more common properties.

As used herein, the terms "optional" and "optionally" mean that the subsequently described event or circumstance may or may not occur and that the description includes instances where the event or circumstance occurs and instances in which it does not. For example, the phrase "optionally surrounded with a shell" means that the shell may or may not be present and that the description includes both the presence and the absence of the shell.

As used herein, the term "photoluminescence" refers to the emission of light of a first wavelength (or a first range of wavelengths) by a material that has been irradiated with light of a second wavelength (or a second range of wavelengths). The first wavelength (or the first range of wavelengths) and the second wavelength (or the second range of wavelengths) can be the same or different.

As used herein, the term "photoluminescence quantum efficiency" refers to the ratio of the number of photons emitted by a material to the number of photons absorbed by the material.

As used herein, the term "Highest Occupied Molecular Orbital" or "HOMO" refers to a highest energy electronic state that is occupied for a material, regardless of the number or density of electronic states and regardless of the presence of band structures.

As used herein, the term "Lowest Unoccupied Molecular Orbital" or "LUMO" refers to a lowest energy electronic state that is unoccupied for a material, regardless of the number or density of electronic states and regardless of the presence of band structures.

As used herein, the term "defect" refers to a crystal stacking error, a trap, a vacancy, an insertion, or an impurity, such as an atomic or molecular dopant.

As used herein, the term "monolayer" refers to a single complete coating of a material with no additional material added beyond the complete coating.

As used herein, the term "photoactive material" refers to a material that can be used to produce electrical energy from light energy. While this term in the context of certain embodiments of the invention is typically used to refer to a nanostructured material, this term can also be used to refer to other photoactive materials, such as conventional photoactive materials.

As used herein, the terms "absorption coefficient" and "oscillator strength" refer to the amount of light absorbed by a material per unit length of the material, such as the amount of light absorbed by the material per unit thickness of the material.

As used herein, the term "charge carrier recombination time" refers to the amount of time during which charge carriers remain separated before recombining. In the case of a photoactive material, a charge carrier recombination time can be an average amount of time during which photoexcited electron-hole pairs remain separated before recombining. Typically, a charge carrier recombination time is inversely related to a "charge carrier recombination rate."

As used herein with reference to a photovoltaic device, the term "short circuit current density" refers to the amount of electric current per unit area that can be provided by the photovoltaic device when operating under a short circuit condition. For example, a short circuit current density can be the amount of electric current per unit area that can be provided by a photovoltaic device when electrodes of the photovoltaic device are coupled via a low-resistance external load, such as a zero-resistance external load.

As used herein, the term "nanometer range" or "nm range" refers to a size range from about 0.1 nm to about 1000 nm, such as from about 0.1 nm to about 500 nm, from about 0.1 nm to about 200 nm, from about 0.1 nm to about 100 nm, from about 0.1 nm to about 50 nm, from about 0.1 nm to about 20 nm, or from about 0.1 nm to about 10 nm.

As used herein, the term "nanoparticle" refers to a particle that has at least one dimension in the nanometer range. A nanoparticle can have any of a number of shapes and can be formed from any of a number of materials. In some instances, a nanoparticle includes a "core" of a first material, which core can be optionally surrounded by a "shell" of a second material or by a "ligand layer." The first material and the second material can be the same or different. Depending on the configuration of a nanoparticle, the nanoparticle can exhibit size dependent properties associated with quantum confinement. However, it is contemplated that a nanoparticle can also substantially lack size dependent properties associated with quantum confinement or can exhibit such size dependent properties to a low degree. In some instances, a set of nanoparticles can be referred to as being "substantially defect free." When referring to a set of nanoparticles as being substantially defect free, it is contemplated that there is fewer than 1 defect per nanoparticle, such as less than 1 defect per 1000 nanoparticles, less than 1 defect per $10^6$ nanoparticles, or less than 1 defect per $10^9$ nanoparticles. Typically, a smaller number of defects within a nanoparticle translates into an increased photoluminescence quantum efficiency. In some instances, a nanoparticle that is substantially defect free can have a photoluminescence quantum efficiency that is greater than 6 percent, such as at least 10 percent, at least 20 percent, at least 30 percent, at least 40 percent, or at least 50 percent. Examples of nanoparticles include quantum dots, quantum wells, and quantum wires.

As used herein, a "size" of a nanoparticle refers to a characteristic physical dimension of the nanoparticle. In the case of a nanoparticle that exhibits size dependent properties associated with quantum confinement, a size of the nanoparticle can refer to a quantum-confined physical dimension of the nanoparticle. For example, in the case of a nanoparticle that is substantially spherical, a size of the nanoparticle corresponds to a diameter of the nanoparticle. In the case of a nanoparticle that is substantially rod-shaped with a substantially circular cross-section, a size of the nanoparticle corresponds to a diameter of the cross-section of the nanoparticle. When referring to a set of nanoparticles as being of a particular size, it is contemplated that the set of nanoparticles can have a distribution of sizes around the specified size. Thus, as used herein, a size of a set of nanoparticles can refer to a mode of a distribution of sizes, such as a peak size of the distribution of sizes.

As used herein, the term "monodisperse" refers to a set of nanoparticles such that at least about 60% of the set of nanoparticles, such as at least about 75% to about 90%, falls within a specified size range. In some instances, a set of monodispersed nanoparticles deviate less than about 20% root-mean-square ("rms") in size, such as less than about 10% rms in size or less than about 5% rms in size.

As used herein, the term "quantum dot" refers to a nanoparticle that exhibits size dependent properties, such as chemical, optical, and electrical properties, substantially along three orthogonal dimensions. A quantum dot can have any of a number of shapes, such as spherical, tetrahedral, tripodal, disk-shaped, pyramid-shaped, box-shaped, cube-shaped, and a number of other geometric and non-geometric shapes. A quantum dot that includes a core surrounded by a shell can be referred to as a "core-shell quantum dot." Examples of quantum dots include nanospheres, nanotetrapods, nanotripods, nanomultipods, and nanoboxes.

As used herein, the term "quantum well" refers to a nanoparticle that exhibits size dependent properties, such as chemical, optical, and electrical properties, substantially along at most a single dimension. An example of a quantum well is a nanoplate.

As used herein, the term "quantum wire" refers to a nanoparticle that exhibits size dependent properties, such as chemical, optical, and electrical properties, substantially along at most two orthogonal dimensions. Examples of quantum wires include nanorods, nanotubes, and nanocolumns, such as those formed from nanoporous semiconductor materials including nanoporous Si and nanoporous Ge.

As used herein, the term "core" refers to an inner portion of a nanoparticle. A core can substantially include a single homogeneous monoatomic or polyatomic material. A core can be crystalline, polycrystalline, or amorphous and can optionally include dopants. A core can be substantially defect free or contain a range of defect densities. While a core sometimes can be referred to as "crystalline" or "substantially crystalline," it is contemplated that the surface of the core can be polycrystalline or amorphous and that this polycrystalline or amorphous surface can extend a measurable depth within the core to form a "core-surface region." The potentially non-crystalline nature of the core-surface region does not change what is described herein as a substantially crystalline core. The core-surface region can sometimes include defects. In some instances, the core-surface region can range in depth from about one to about five atomic-layers and can be substantially homogeneous, substantially inhomogeneous, or continuously varying as a function of position within the core-surface region.

As used herein, the term "shell" refers to an outer portion of a nanoparticle. A shell can include a layer of a material that covers at least a portion of the surface of a core. An interface region can be optionally positioned between a core and a shell. A shell can substantially include a single homogeneous monoatomic or polyatomic material. A shell can be crystalline, polycrystalline, or amorphous and can optionally include dopants. A shell can be substantially defect free or contain a range of defect densities. In some instances, a material forming a shell has a bandgap energy that is larger than that of a material forming a core. In other instances, the material forming the shell can have a bandgap energy that is smaller than that of the material forming the core. The material forming the shell can have band offsets with respect to the material forming the core, such that a conduction band of the shell can be higher or lower than that of the core, and a valence band of the shell can be higher or lower than that of the core. The material forming the shell can be optionally selected to have an atomic spacing close to that of the material forming the core. A shell can be "complete," such that the shell substantially completely covers the surface of a core to, for example, substantially cover all surface atoms of the core. Alternatively, the shell can be "incomplete," such that the shell partially covers the surface of the core to, for example, partially cover the surface atoms of the core. A shell can have a range of thicknesses, such as from about 0.1 nm to about 10 nm. The thickness of a shell can be defined in terms of the number of monolayers of a material forming the shell. In some instances, a shell can have a thickness from about 0 to about 10 monolayers. A non-integer number of monolayers can correspond to a state in which incomplete monolayers exist. Incomplete monolayers can be homogeneous or inhomogeneous and can form islands or clumps on the surface of a core. A shell can be uniform or nonuniform in thickness. In the case of a shell having nonuniform thickness, it is contemplated that an incomplete shell can include more than one monolayer of a material. A shell can optionally include multiple layers of one or more materials in an onion-like structure, such that each layer acts as a shell for the next-most inner layer. Between each layer there is optionally an interface region.

As used herein, the term "interface region" refers to a boundary between two or more portions of a nanoparticle. For example, an interface region can be positioned between a core and a shell or between two layers of the shell. In some instances, an interface region can exhibit an atomically discrete transition between a material forming one portion of a nanoparticle and a material forming another portion of the nanoparticle. In other instances, the interface region can be an alloy of materials forming two portions of the nanoparticle. An interface region can be lattice-matched or unmatched and can be crystalline, polycrystalline, or amorphous and can optionally include dopants. An interface region can be substantially defect free or contain a range of defect densities. An interface region can be homogeneous or inhomogeneous and can have properties that are graded between two portions of a nanoparticle, such as to provide a gradual or continuous transition. Alternatively, the transition can be discontinuous. An interface region can have a range of thicknesses, such as from about 1 to about 5 atomic layers.

As used herein, the term "ligand layer" refers to a set of surface ligands surrounding a core of a nanoparticle. A nanoparticle including a ligand layer can also include a shell. As such, a set of surface ligands of the ligand layer can be bound, either covalently or non-covalently, to a core, a shell, or both (in the case of an incomplete shell). A ligand layer can include a single type of surface ligand, such as a single molecular species, or a mixture of two or more types of surface ligands, such as two or more different molecular species. A surface ligand can have an affinity for, or bind selectively to, a core, a shell, or both, at least at one portion of the surface ligand. A surface ligand can optionally bind at multiple portions along the surface ligand. A surface ligand can optionally include one or more additional active groups that do not interact specifically with either a core or a shell. A surface ligand can be substantially hydrophilic, substantially hydrophobic, or substantially amphiphilic. Examples of surface ligands include organic molecules, polymers (or monomers for a polymerization reaction), inorganic complexes, molecular tethers, nanoparticles, and extended crystalline structures. A ligand layer can have a range of thicknesses. The thickness of a ligand layer can be defined in terms of the number of monolayers of a set of surface ligands forming the ligand layer. In some instances, a ligand layer has a thickness of a single monolayer or less, such as substantially less than a single monolayer.

As used herein, the term "nano-network" refers to an arrangement or a system of nanoparticles. In some instances, a nano-network has at least one dimension in the nanometer range. Nano-networks can be distinguished from one another based on materials forming the nano-networks, configuration or morphology of the nano-networks, or both. An example of a nano-network is a set of fused or interconnected nanoparticles in which the degree of fusion or interconnection can vary over a wide range, such as from little or no fusion or interconnection to complete fusion or interconnection. Such nano-network can be interdispersed, interpenetrating, fused, interconnected, or layered with any number of other nano-networks. Another example of a nano-network is a set of nanoparticles dispersed at some concentration or number density in a matrix. A further example of a nano-network is a set of nanoparticles that are spatially extended, such as an array of substantially aligned nanorods, nanocolumns, nanotubes, or quantum wires.

Nanostructured Materials

Certain embodiments of the invention relate to nanostructured materials that can be used for optoelectronic devices, such as photovoltaic devices, photoconductors, photodetectors, Light Emitting Devices ("LEDs"), lasers, and other devices that involve photons and charge carriers during their operation. The configuration and resulting properties of nanostructured materials can be engineered for a desired level of performance for a number of optoelectronic applications. In some instances, engineering of nanostructured materials can involve trade-offs between a number of properties, such as light absorption, charge separation, charge carrier recombination and trapping, and charge carrier transport and collection. According to some embodiments of the invention, the configuration of nanostructured materials can cover a wide range between two types of material morphology, which are designated as a Percolation Limit and a Contiguous Limit. As further discussed below, the Percolation Limit and the Contiguous Limit typically differ in their degree of contiguousness or connectivity. Within this range of material morphologies, a set of nano-networks can be used to promote a number of desirable properties, which, in the case of photovoltaic devices, include, for example, effective light absorption, effective charge separation, reduced charge carrier recombination and trapping, and effective charge carrier transport and collection.

In the Percolation Limit, at least a portion of a nanostructured material has a non-contiguous configuration. For example, the nanostructured material can include a set of nano-networks, and at least one of the set of nano-networks can have a non-contiguous configuration. In some instances, at least a subset of nanoparticles that form a nano-network are discrete, are not fused or interconnected, or are fused or interconnected to a low degree. For example, a nanostructured material can include a set of nanoparticles dispersed in a matrix. Due to the non-contiguous configuration in the Percolation Limit, charge carrier transport typically occurs via a hopping or tunneling mechanism. Typically, a relatively high concentration or number density of the nanoparticles is desirable to reach a percolation threshold, which allows effective charge carrier transport from one nanoparticle to another nanoparticle.

In the Contiguous Limit, a nanostructured material has a contiguous configuration. For example, the nanostructured material can include a set of nano-networks, and each of the set of nano-networks can have a contiguous configuration. In some instances, a set of nanoparticles that form a nano-network are fused or interconnected. Advantageously, such nano-network provides contiguous conductive paths, which allow effective charge carrier transport without relying on less effective transport mechanisms, such as a hopping or tunneling mechanism. At the same time, the degree of fusion or interconnection of the nanoparticles can be adjusted, such that engineerable properties associated with quantum confinement are substantially retained. In other instances, a set of nanoparticles that form a nano-network are spatially extended. Advantageously, such nano-network provides contiguous conductive paths, which allow effective charge carrier transport without having to fuse or interconnect the nanoparticles. An example of such nano-network is an array of substantially aligned nanorods, nanocolumns, nanotubes, or quantum wires.

Between the Percolation Limit and the Contiguous Limit, a nanostructured material can have any of a range of material morphologies distinguished by their degree of contiguousness or connectivity. In some instances, the degree of contiguousness or connectivity can be continuously adjusted by, for example, varying a concentration or number density of nanoparticles, varying the degree of fusion or interconnection of the nanoparticles, varying the spatial extent of the nanoparticles, or a combination thereof. The resulting nanostructured material can range from having a highly convoluted or circuitous configuration for some embodiments of the invention to having a non-convoluted and aligned configuration for other embodiments of the invention.

At and between the Percolation Limit and the Contiguous Limit, any number of nano-networks can be interdispersed, interpenetrated, fused, interconnected, or layered to at least some degree with any number of other nano-networks. Various nano-networks of a nanostructured material can be formed from the same material or from different materials. FIG. 1 illustrates a nanostructured material 100 that includes two nano-networks 102 and 104 interpenetrating one other, according to an embodiment of the invention. In the illustrated embodiment, the nano-network 102 is formed from a set of fused or interconnected Si nanoparticles, while the nano-network 104 is formed from a set of fused or interconnected Ge nanoparticles. The degree of fusion or interconnection of the Si nanoparticles forming the nano-network 102 can vary over a wide range, such as from little or no fusion or interconnection to complete fusion or interconnection. Similarly, the degree of fusion or interconnection of the Ge nanoparticles forming the nano-network 104 can vary over a wide range, such as from little or no fusion or interconnection to complete fusion or interconnection. For other embodiments of the invention, it is contemplated that both nano-networks 102 and 104 can be formed from either Si nanoparticles or Ge nanoparticles, and the nano-networks 102 and 104 can differ in their configurations or differ in sizes of their respective nanoparticles.

Nanostructured materials according to various embodiments of the invention can be formed using a number of materials, such as:

1. Inorganic materials, such as doped or undoped inorganic semiconductor materials, inorganic polymers, inorganic oligomers, and inorganic molecules;
2. Organic materials, such as doped or undoped organic semiconductor materials, organic polymers, organic oligomers, and organic molecules;
3. Metals;
4. Doped materials;
5. Undoped materials;
6. Solid state materials;
7. Liquid state materials; and
8. Combinations of the above.

For certain applications, use of inorganic materials can be advantageous, since these materials can impart a desired level of robustness and stability. In addition, use of solid state materials can be advantageous based on similar robustness and stability reasons. For example, a nanostructured material according to an embodiment of the invention can correspond to an all-inorganic, all-solid state nanostructured material that includes at least one nano-network.

Nanostructured materials according to various embodiments of the invention can be formed using a number of methods, such as:

1. Dispersing a set of nanoparticles in a matrix;
2. Directly forming a nanostructured material with a contiguous and spatially extended configuration;
3. Fusing a set of nanoparticles in which the degree of fusion can range from little or no fusion to complete fusion;
4. Interconnecting a set of nanoparticles (such as using surface ligands, quantum wires, or other structures attached to surfaces of the nanoparticles) in which the degree of interconnection can range from little or no interconnection to complete interconnection;
5. Fusing various portions of a material in which the degree of fusion can range from little or no fusion to complete fusion;
6. Interconnecting various portions of a material (such as using surface ligands, quantum wires, or other structures attached to surfaces of the portions) in which the degree of interconnection can range from little or no interconnection to complete interconnection; and
7. Combinations of the above, such as by fusing certain portions of a material and both interconnecting and fusing other portions of the material.

Nanostructured materials according to various embodiments of the invention can be formed as films having a number of configurations, such as:

1. A nanostructured material can be formed as a film of a single material, such as a single component film, and can include a single nano-network.
2. A nanostructured material can be formed as a film of a single material, such as a single component film, and can include multiple nano-networks. In this case, the nano-networks can differ in their configurations or morphologies, differ in sizes of their respective nanoparticles, or differ in their doping. The nano-networks can be interdispersed, interpenetrating, fused, interconnected, or layered with one another. For example, the nano-networks can be formed from nanoparticles of different sizes, can be arranged in different material morphologies, can be doped differently, or a combination thereof. In particular, the nano-networks can be formed from Ge nanoparticles and can differ in their doping. As further discussed below, boundaries between the nano-networks can form homojunctions that allow effective charge separation. By engineering bandgap energies and the number of these homojunctions, these homojunctions can allow effective light absorption, such that a wider range of an incident light spectrum can be efficiently converted to useful electrical energy.
3. A nanostructured material can be formed as a film of multiple materials, such as a multi-component film, and can include multiple nano-networks. In this case, the nano-networks can differ in their materials, differ in their configurations or morphologies, differ in sizes of their respective nanoparticles, or differ in their doping. The nano-networks can be interdispersed, interpenetrating, fused, interconnected, or layered with one another. For example, the nano-networks can be formed from Si nanoparticles and Ge nanoparticles that can have different sizes, that can be arranged in different material morphologies, that can be doped differently, or a combination thereof. As further discussed below, boundaries between the nano-networks can form heterojunctions that allow effective charge separation. By engineering bandgap energies and the number of these heterojunctions, these heterojunctions can allow effective light absorption, such that a wider range of an incident light spectrum can be efficiently converted to useful electrical energy.
4. A nanostructured material can be formed as a film of a single material, such as a single component film, and can include nanoparticles that are fused completely to "full density."
5. A nanostructured material can be formed as a film of multiple materials, such as a multi-component film, and can include nanoparticles that are fused completely to "full density."
6. A nanostructured material can be formed as a film including a single layer of nanoparticles.
7. A nanostructured material can be formed as a combination of the above, such as a film including multiple layers of one or more of the above categories. For example, a nanostructured material can be formed as a film that includes multiple layers of category 3 discussed above. In this case, boundaries between the layers can form heterojunctions that allow effective charge separation. By engineering bandgap energies within these heterojunctions, these heterojunctions can allow effective light absorption, such that a wider range of an incident light spectrum can be efficiently converted to useful electrical energy.

Nanoparticles and Engineerable Properties

Nanostructured materials according to various embodiments of the invention can be formed using nanoparticles. Advantageously, use of nanoparticles allows nanostructured materials to be engineered as photoactive materials having a number of desirable properties, including, for example, effective light absorption, effective charge separation, reduced charge carrier recombination and trapping, and effective charge carrier transport and collection.

Examples of nanoparticles that can be used include:
1. Nanoparticles that exhibit size dependent properties associated with quantum confinement along at least one dimension:
   a. Quantum dots;
   b. Quantum wells; and
   c. Quantum wires;
2. Nanoparticles that lack size dependent properties associated with quantum confinement or that exhibit such size dependent properties to a low degree; and
3. Combinations of the above.

Examples of desirable properties of nanoparticles include:
1. In a film or a non-film form, effectively absorbs light energy from a light source in terms of spectral extent and strength of absorption coefficient;
2. In a film or a non-film form, effectively transports charge carriers;
3. Able to be formed into nano-networks under relatively mild conditions;
4. Substantially non-toxic; and
5. Combinations of the above.

Nanoparticles according to various embodiments of the invention can be formed using a number of materials, such as:
1. Inorganic materials, such as doped or undoped inorganic semiconductor materials, inorganic polymers, inorganic oligomers, and inorganic molecules;
2. Organic materials, such as doped or undoped organic semiconductor materials, organic polymers, organic oligomers, and organic molecules;
3. Metals;
4. Metal Oxides, such as doped or undoped metal oxides;
5. Alloys;
6. Dielectric materials;
7. Ceramics; and
8. Combinations of the above.

Nanoparticles according to various embodiments of the invention can be formed using elemental and non-elemental materials, such as:
1. Elemental materials:
   a. Group IV semiconductor materials, such as C, Si, Ge, Sn, and Pb;
2. Binary materials:
   a. Group IV-IV semiconductor materials, such as $Si_xC_y$, $Ge_xC_y$, and $Si_xGe_y$;
   b. Group II-VI semiconductor materials, such as CdSe, CdS, ZnO, $SnO_2$, NiO, and $WO_3$; and
   c. Group III-V semiconductor materials, such as GaAs, InAs, InP, InSb, GaP, GaSb, and GaN;
3. Tertiary materials;
4. Quartenary materials; and
5. Combinations of the above.

For some embodiments of the invention, quantum-confined nanoparticles are desirable, since these nanoparticles have properties that can be engineered by exploiting quantum confinement effects. In some instances, properties of nanoparticles can be engineered by, for example, controlling sizes of the nanoparticles, controlling shapes of the nanoparticles, controlling materials forming cores of the nanoparticles, controlling materials forming shells of the nanoparticles, controlling thickness of the shells of the nanoparticles, controlling interface regions of the nanoparticles, controlling surface ligands of the nanoparticles, controlling properties of a matrix in which the nanoparticles are dispersed, or a combination thereof. Advantageously, nano-networks and nanostructured materials can be formed from such quantum-confined nanoparticles, such that engineerable properties associated with quantum confinement are substantially retained.

An example of an engineerable property is a bandgap energy. For a quantum-confined nanoparticle, a light absorption edge is typically related to a bandgap energy, which, in turn, can be determined by a size of the nanoparticle, a shape of the nanoparticle, a material forming a core of the nanoparticle, a material forming a shell of the nanoparticle, a thickness of the shell of the nanoparticle, surface ligands of the nanoparticle, and properties of a matrix in which the nanoparticle is dispersed. The size of the nanoparticle typically has the largest effect on the bandgap energy. For example, as the size of the nanoparticle decreases, the bandgap energy typically increases. Thus, as the size of the nanoparticle decreases, the light absorption edge typically increases to higher energies. Typically, a bandgap energy increases as the inverse of a quantum-confined physical dimension raised to some power. In the case of a nanoparticle that is substantially spherical, a bandgap energy can depend on a size of the nanoparticle as follows:

$$E_g(d) = E_g(\infty) + \frac{C}{d^n},$$

where d represents a diameter of the nanoparticle, $E_g(d)$ represents the bandgap energy of the nanoparticle for diameter d, $E_g(\infty)$ represents a bandgap energy of a bulk material, C represents a constant that depends on the particular material involved, and n typically ranges from about 1 to about 2. Accordingly, a light absorption edge of the nanoparticle can be engineered by controlling its size. As a result, light absorption can be optimized or tailored for a particular light source, such as sunlight at different times of the day and under different atmospheric conditions, a fluorescence light source, an incandescent light source, LEDs, lasers, or electrical arcs. In addition, light absorption can be engineered, such that the nanoparticle can selectively absorb a particular range of an incident light spectrum, thus allowing other ranges of the incident light spectrum to be transmitted. Such nanoparticle can be useful in photovoltaic devices that also serve as building materials, such as windows, where higher energy photons in sunlight are absorbed and converted to electrical energy, while lower energy photons are transmitted to allow viewing. According to some embodiments of the invention, light absorption can be engineered, such that the resulting nanostructured material has an absorption spectrum in the range of from about 300 nm to about 2000 nm, such as from about 300 nm to about 1850 nm, from about 400 nm to about 1850 nm, from about 400 nm to about 1100 nm, from about 400 nm to about 885 nm, or from about 400 nm to about 700 nm.

A bandgap energy and a light absorption edge of a nanoparticle are typically related to HOMO and LUMO energy levels and density of electronic states of the nanoparticle. The HOMO and LUMO energy levels can be engineered by, for example, controlling a size of the nanoparticle, controlling a shape of the nanoparticle, controlling a material forming a core of the nanoparticle, controlling a material forming a shell of the nanoparticle, controlling a thickness of the shell of the nanoparticle, controlling surface ligands of the nanoparticle, and controlling properties of a matrix in which the nanoparticle is dispersed. For example, as the size of the nanoparticle decreases, the HOMO and LUMO energy levels typically shift apart from one another, which increases the bandgap energy as discussed previously. In some instances, the degree that the HOMO and LUMO energy levels shift can be different. For example, an energy level that is associated with a smaller effective mass can shift to a greater degree. As further discussed below, engineering of the HOMO and LUMO energy levels can promote charge separation by providing appropriate band offsets and can provide a particular metal/material junction, such as an Ohmic or rectifying contact.

Another example of an engineerable property is an absorption coefficient or oscillator strength. Typically, as a quantum-confined physical dimension decreases, the absorption coefficient or oscillator strength increases. Engineering of the absorption coefficient can be optimized or tailored for a particular light source, such as sunlight at different times of the day and under different atmospheric conditions, a fluorescence light source, an incandescent light source, LEDs, lasers, or electrical arcs. Also, an increased absorption coefficient can allow significantly thinner films that can absorb adequate amounts of light energy. For example, a film having a thicknesses from about 10 nm to about 100 nm can provide effective absorption of sunlight. A thinner film allows photoexcited charge carriers to travel shorter distances to electrodes, thus reducing charge carrier recombination and trapping and increasing conversion efficiency by allowing more charge carriers to reach the electrodes. An absorption coefficient can also be engineered by, for example, controlling a material forming a shell of a nanoparticle or controlling surface ligands of the nanoparticle. For example, the shell or the surface ligands can be selected so as to absorb light energy. According to some embodiments of the invention, the resulting nanostructured material can have an absorption coefficient (within its absorption spectrum) that is at least about $10^3$ $cm^{-1}$, such as from about $10^3$ $cm^{-1}$ to about $10^6$ $cm^{-1}$; at least about $10^4$ $cm^{-1}$, such as from about $10^4$ $cm^{-1}$ to about $10^6$ $cm^{-1}$; or at least about $10^5$ $cm^{-1}$, such as from about $10^5$ $cm^{-1}$ to about $10^6$ $cm^{-1}$.

Another example of an engineerable property is an optical index of refraction of a nanostructured material formed from nanoparticles. Typically, as a size of the nanoparticles decreases, a dielectric constant and index of refraction of the nanostructured material decreases. By selecting the nanoparticles that have an appropriate size, an index of refraction can be engineered to reduce reflective losses for a particular light source. In some instances, the resulting nanostructured material can serve as an anti-reflective material.

Another example of an engineerable property is charge separation. In some instances, boundaries between interdispersed or interpenetrating nano-networks or between layers of nano-networks can serve as charge separation regions that substantially pervade an entire nanostructured material. As a result, most photoexcited charge carrier pairs, such as photoexcited electron-hole pairs, are typically within a few nanometers from such boundaries where charge separation can occur. Therefore, charge separation can be effective for most photoexcited charge carrier pairs, regardless of their locations in the nanostructured material.

Figure 2A:
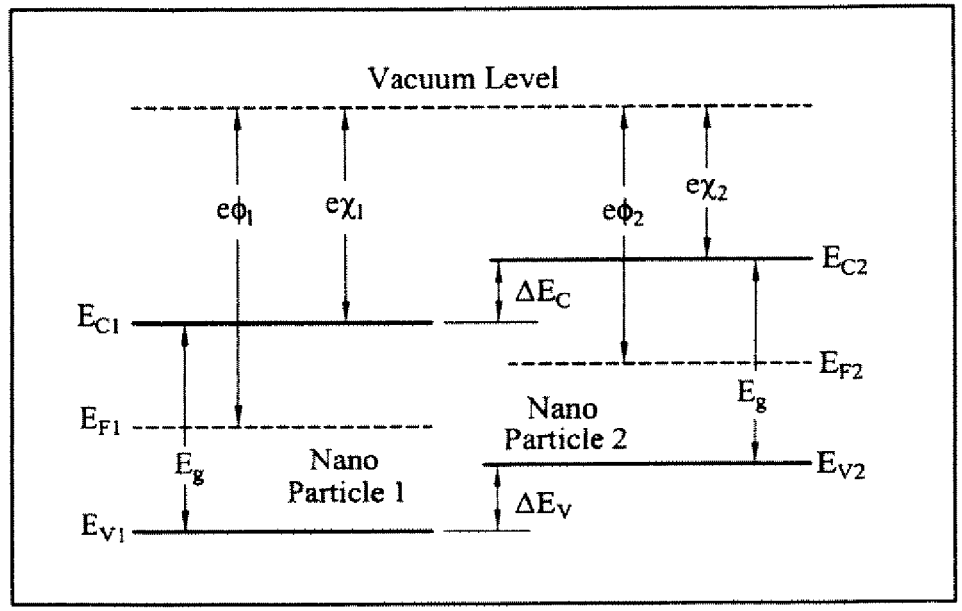
FIG. 2A, FIG. 2B, and FIG. 2C illustrate different types of band offsets that can occur between nanoparticles forming two nano-networks, according to an embodiment of the invention.
Figure 2B:
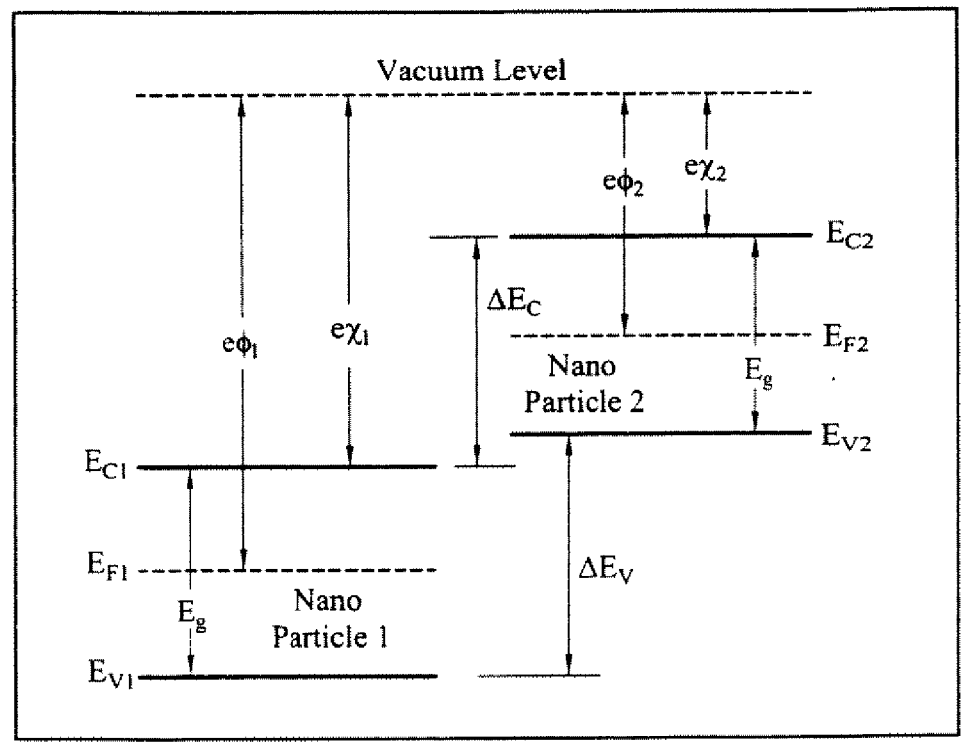
Figure 2C:
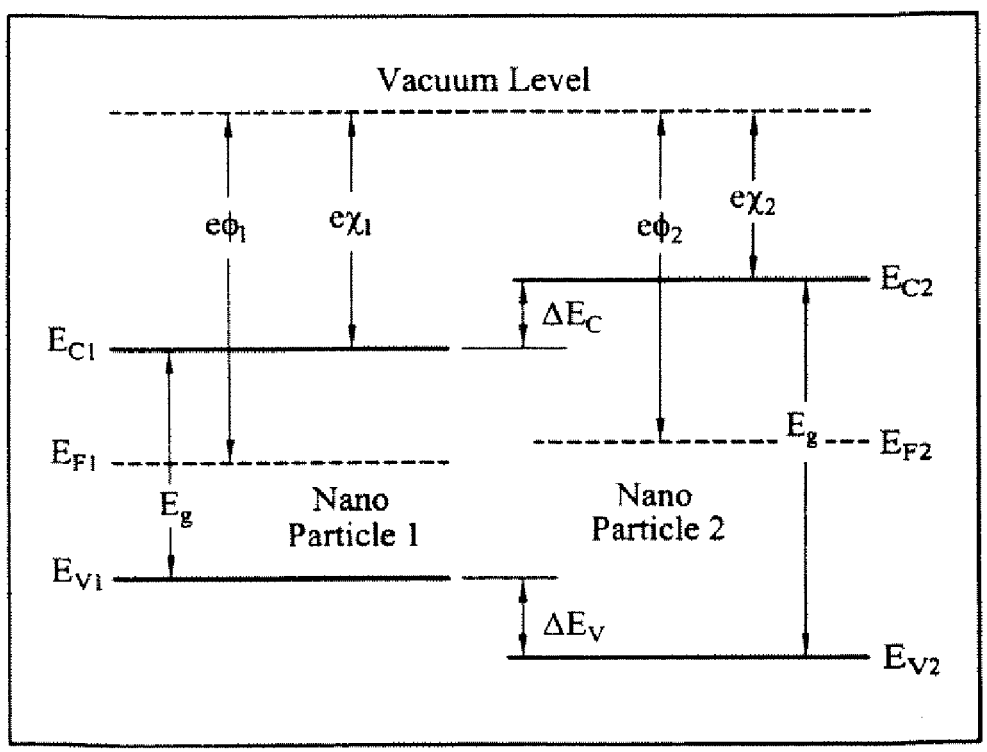

Charge separation can occur via any of a number of mechanisms. For example, charge separating junctions at boundaries between interdispersed or interpenetrating nano-networks or between layers of nano-networks can be formed using materials with effective band offsets, using materials with different electron affinities or ionization potentials, using materials with different work functions, using materials with different bandgap energies to form heterojunctions, using doped materials, or a combination thereof. Charge separation can also be engineered by, for example, controlling a material forming a shell of a nanoparticle, controlling surface ligands of the nanoparticle, or controlling depletion lengths or barrier heights and widths. Charge separation into nano-networks that are not doped or are lightly doped can be driven by effective band offsets between HOMO and LUMO energy levels of materials involved. FIG. 2A, FIG. 2B, and FIG. 2C illustrate different types of band offsets that can occur between nanoparticles forming two nano-networks, according to an embodiment of the invention. In particular, FIG. 2A, FIG. 2B, and FIG. 2C illustrate a staggered band offset, a broken gap band offset, and a straddling gap band offset, respectively. Provided that effective band offsets exceed Coulomb interactions or exciton binding energies, electrons can preferentially separate into and be transported in a nano-network formed from a material with the largest electron affinity, while holes can preferentially separate into and be transported in a nano-network formed from a material with the smallest ionization potential.

Advantageously, an appropriate electronic structure can be engineered by exploiting quantum confinement effects. For example, various types of band offsets can be engineered by controlling a size of nanoparticles, which, in turn, controls HOMO and LUMO energy levels and electron affinities and ionization potentials. In some instances, a built-in or applied electric field can assist charge separation as well as subsequent charge carrier transport. A built-in electric field can result from work function differences of materials forming a nanostructured material or work function differences of materials forming the nanostructured material and an electrode. For example, the relevant energetics required for charge separation can involve a difference in work function or Fermi levels of nano-networks. In other instances, a built-in electric field need not be present for charge separation. A chemical potential gradient or an electrical potential gradient can result from a non-uniform distribution of charge carriers, such as resulting from electrons and holes separating into different materials or different nano-networks or from any other asymmetry associated with charge separation, and this chemical potential gradient or electrical potential gradient can sometimes suffice to produce an electric current or voltage. In the case a single material is involved, the preference of electrons and holes to be collected onto different electrodes (or any other asymmetry associated with charge separation) can sometimes suffice to produce an electric current or voltage.

As discussed previously, an appropriate electronic structure can be engineered by exploiting quantum confinement effects. Engineering of the electronic structure can be provided through doping of nano-networks or by manipulating surface functionalization conditions. In the case of doped nano-networks, such as formed from fused or interconnected nanoparticles that are doped, charge separation and subsequent charge carrier transport can occur in a similar fashion as for nano-networks that are not doped or are lightly doped. However, the relevant energy levels for doped nano-networks typically correspond to Fermi levels, which are related to work functions. Electrons can preferentially separate into and be transported in a nano-network that is more n-type (as determined by its Fermi level), while holes can preferentially separate into and be transported in a nano-network that is more p-type (as determined by its Fermi level). In the case of doped nano-networks, junctions that are formed can exhibit band bending rather than band tilting as is typically the case with undoped or lightly doped nano-networks.

Figure 3:
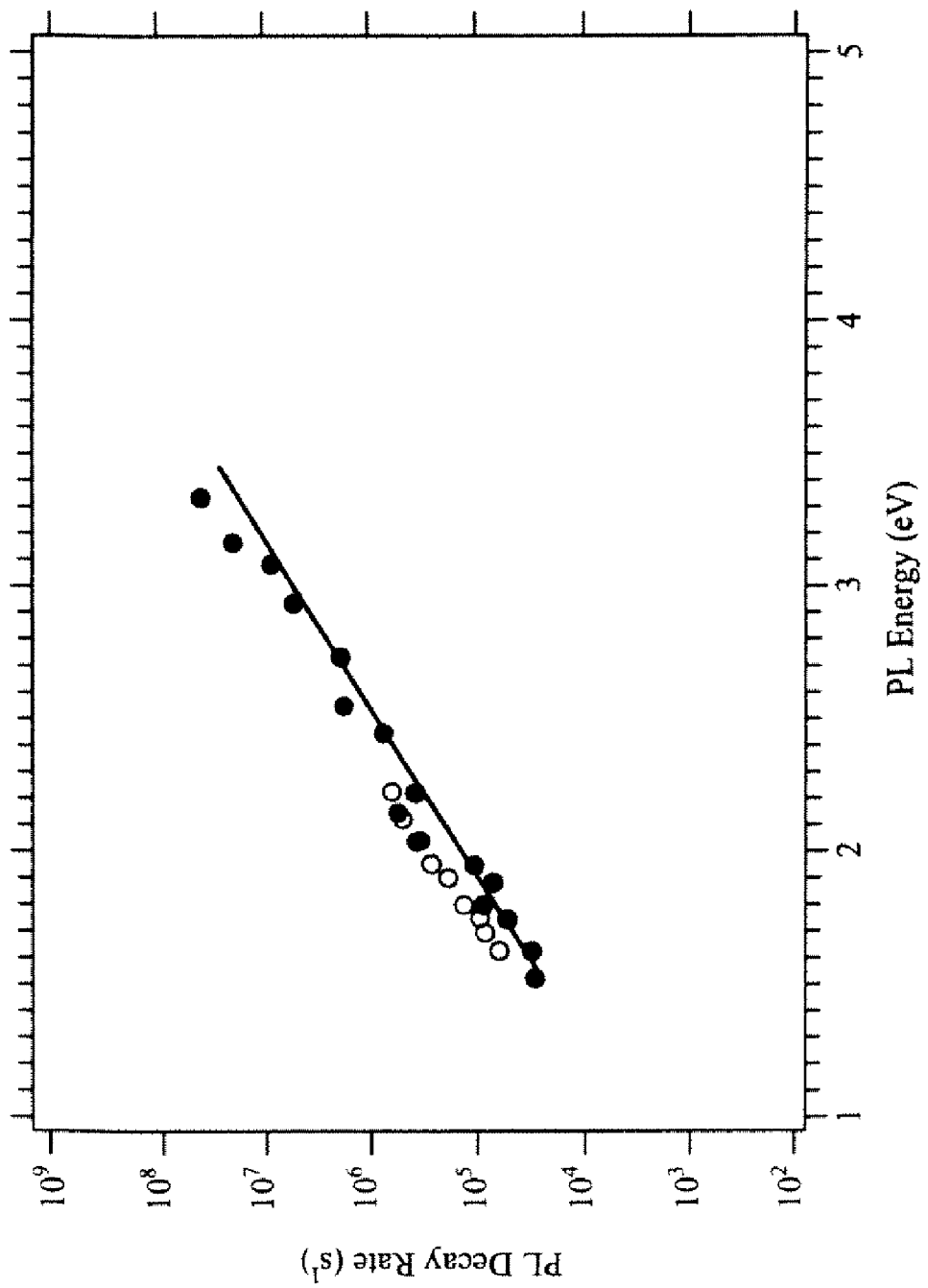
FIG. 3 illustrates a plot of photoluminescence decay rate as a function of photoluminescence energy, according to an embodiment of the invention.

Another example of an engineerable property is a charge carrier recombination rate. For a nanoparticle formed from an indirect bandgap material, such as Si, Ge, $Si_xC_y$, $Si_xGe_y$, or $Ge_xC_y$, a charge carrier recombination rate typically increases as a size of the nanoparticle decreases. This dependence can be understood with reference to FIG. 3, which illustrates a plot of photoluminescence decay rate as a function of photoluminescence energy. This dependence can be exploited by appropriately controlling the size of the nanoparticle to decrease the charge carrier recombination rate. For example, the charge carrier recombination rate can be engineered, such that a transit time of charge carriers across a film is shorter than a charge carrier recombination time. In such manner, charge carriers can be transported across the film and can reach electrodes before recombining. According to some embodiments of the invention, the resulting nanostructured material can have a charge carrier recombination time that is at least about 1 ns, such as from about 1 ns to about 10 ms; at least about 10 ns, such as from about 10 ns to about 0.05 ms or from about 10 ns to about 10 ms; at least about 100 ns, such as from about 100 ns to about 0.5 ms or from about 100 ns to about 10 ms; or at least about 1000 ns, such as from about 1000 ns to about 10 ms.

A further example of an engineerable property is a charge carrier mobility or electrical conductivity, which can be engineered by controlling a configuration of a nanostructured material formed from nanoparticles. For example, at or near the Percolation Limit, charge carrier transport typically occurs via a hopping or tunneling mechanism. Accordingly, charge carrier mobility can be increased by increasing a concentration or number density of nanoparticles, thus decreasing the number of hopping or tunneling steps required. As another example, a degree of fusion or interconnection of nanoparticles or type of interconnection of the nanoparticles can be controlled for a nanostructured material towards the Contiguous Limit. Typically, a higher degree of fusion or interconnection can provide a higher charge carrier mobility. As a further example, charge carrier mobility can be engineered by aligning nanoparticles to provide substantially direct or straight conductive paths. Typically, a direct or straight conductive path provides a higher charge carrier mobility as compared with a convoluted conductive path. As yet a further example, charge carrier mobility can be engineered in the case of interconnected nanoparticles by selecting surface ligands that are used to interconnect the nanoparticles. The surface ligands can be selected to enhance or deter charge carrier transport based on, for example, electrical properties and lengths of the surface ligands. In some instances, surface ligands including conjugated groups, such as conjugated conducting polymers, and having appropriate energetics can provide a higher charge carrier mobility between nanoparticles than surface ligands without such conjugated groups. It is contemplated that the selection of surface ligands can also be used to engineer other properties of a nanostructured material, such as a bandgap energy, positions of HOMO and LUMO energy levels, light absorption, a charge carrier recombination rate, an index of refraction, as well as the nature of any junctions that are formed. Charge carrier mobility can also be engineered by selecting shells of nanoparticles. In particular, the shells can be selected to enhance or deter charge carrier transport based on, for example, electrical properties of the shells. Engineering of charge carrier mobility can be particularly advantageous for certain optoelectronic devices, such as multi-component photovoltaic devices. In particular, by engineering charge carrier mobility as discussed above, electric currents at different portions or layers of such optoelectronic devices can be adjusted to be substantially similar.

Advantageously, nanostructured materials according to various embodiments of the invention can provide effective charge carrier transport and can support relatively high electric currents, as compared with conventional photoactive materials. For example, at or near the Contiguous Limit, a nanostructured material can provide contiguous conductive paths between electrodes, which allow effective charge carrier transport without relying on less effective transport mechanisms, such as a hopping or tunneling mechanism. In some instances, the contiguous conductive paths can allow band-like electrical conduction to occur. Following charge separation, separated charge carriers can be transported separately and away from each other in respective nano-networks to different electrodes. In particular, positive charge carriers and negative charge carriers can be transported to different electrodes via respective nano-networks: one nano-network for the positive charge carriers, and another nano-network for the negative charge carriers. Accordingly, charge carrier transport can be based on majority charge carrier transport rather than minority charge carrier transport. Majority charge carrier transport can allow more efficient performance by mitigating impact of charge carrier recombination and defects, thus allowing more relaxed fabrication conditions.

Engineering of nanostructured materials can sometimes involve trade-offs between a number of desirable properties, such as effective light absorption, effective charge separation, reduced charge carrier recombination and trapping, and effective charge carrier transport. In particular, certain properties can change in a contravening manner, such as when controlling sizes of nanoparticles, controlling shapes of the nanoparticles, controlling materials forming cores of the nanoparticles, controlling materials forming shells of the nanoparticles, controlling thickness of the shells of the nanoparticles, controlling interface regions of the nanoparticles, controlling surface ligands of the nanoparticles, controlling properties of a matrix in which the nanoparticles are dispersed, or a combination thereof. Accordingly, a compromise between a number of desirable properties can be sought to obtain a desired level of overall performance. Examples of properties that can change in a contravening manner include an index of refraction and the extent to which a light absorption edge extends into an infrared range of an incident light spectrum. Typically, smaller nanoparticles have smaller indices of refraction, which can be desirable for mitigating surface reflection for light energy propagating from a medium with a lower index of refraction, such as any of a number of liquids and gases. However, smaller nanoparticles can sometimes provide light absorption that extends less into the infrared range, which can be less desirable for solar applications of photovoltaic devices. Other examples of properties that can change in a contravening manner include light absorption and charge carrier transport. Typically, a thicker film of a nanostructured material allows more light energy to be absorbed. However, charge carrier transport can sometimes suffer as a result of longer paths traversed by charge carriers before reaching electrodes. As discussed previously, use of smaller nanoparticles can provide an increased absorption coefficient, which allows a thinner film that can absorb adequate amounts of light energy while providing adequate charge carrier transport. However, as discussed previously, smaller nanoparticles can sometimes provide light absorption that extends less into the infrared range, which can be less desirable for solar applications of photovoltaic devices.

Engineering of nanostructured materials can also involve considerations regarding the degree to which nanoparticles are fused or interconnected. As nanoparticles are fused or interconnected to form a nanostructured material, properties of the nanoparticles associated with quantum confinement can sometimes change as a result of changes in the effective quantum-confined physical dimension. Accordingly, the degree to which the nanoparticles are fused or interconnected can be controlled to obtain a desired level of performance.

Nanoparticles of Group IV Semiconductor Materials

Nanoparticles according to some embodiments of the invention can be formed using indirect bandgap materials, such as Group IV semiconductor materials. For example, Si nanoparticles and Ge nanoparticles can be used either alone or in combination to form interdispersed, interpenetrating, fused, interconnected, or layered nano-networks. According to some embodiments of the invention, Group IV semiconductor materials are desirable, since their chemical, optical, electronic, and physical properties make them particularly suitable for solar applications of photovoltaic devices. In some instances, elemental Group IV semiconductor materials, such as Si and Ge, are particularly desirable to mitigate impact of non-stoichiometry and defects.

Figure 4:
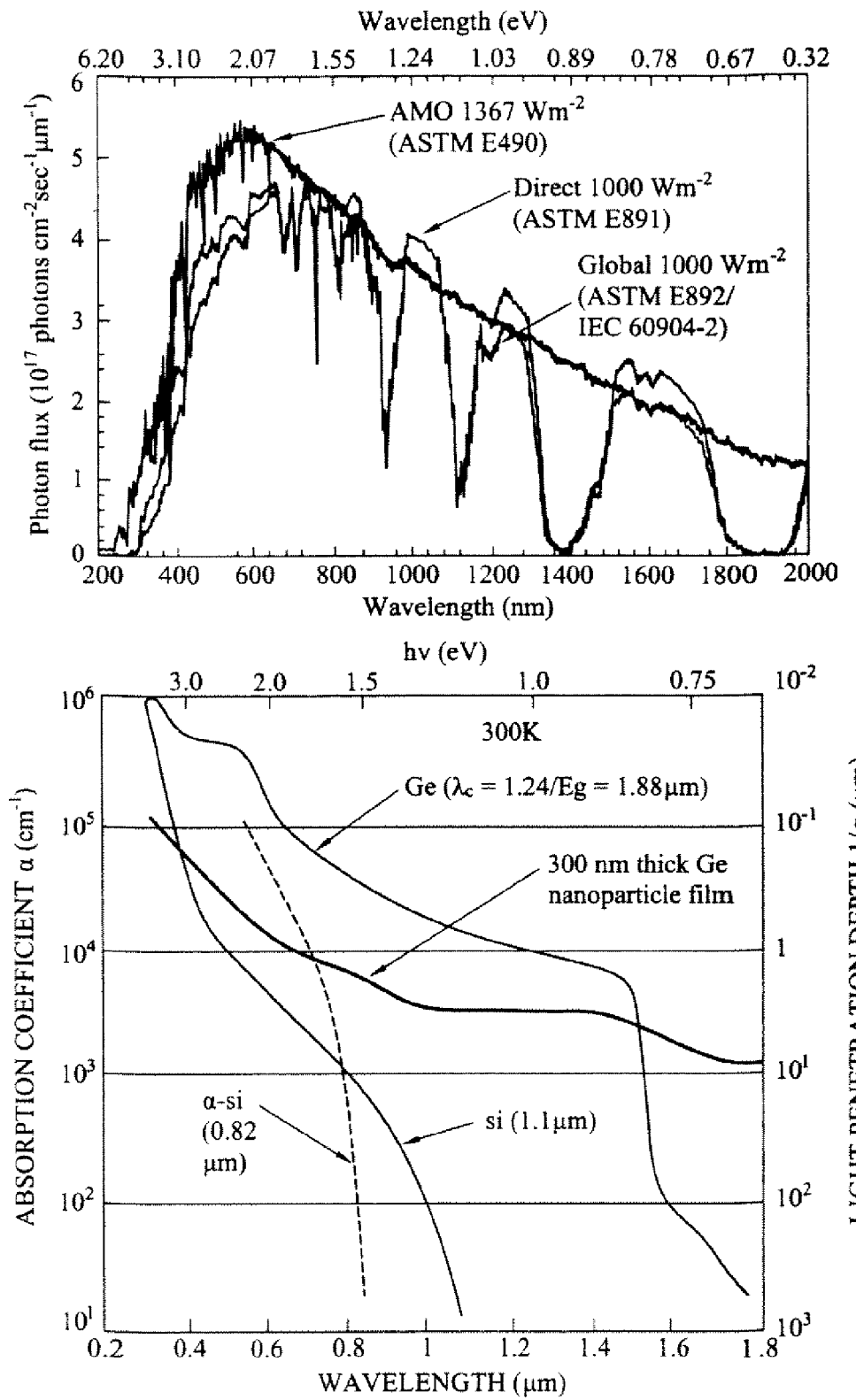
FIG. 4 illustrates a solar spectrum and absorption of this solar spectrum by bulk Si, bulk Ge, and Ge nanoparticles formed according to an embodiment of the invention.

Bandgap energies of bulk Si and bulk Ge are 1.12 eV and 0.67 eV, respectively, which allow a significant portion of a solar spectrum to be absorbed by Si and Ge in bulk form or as quantum-confined structures. FIG. 4 illustrates a solar spectrum and absorption of this solar spectrum by bulk Si, bulk Ge, and Ge nanoparticles formed according to an embodiment of the invention. Both Si and Ge have above bandgap transitions that can provide relatively large absorption coefficients. In particular, absorption coefficients of Si and Ge in bulk form can exceed $10^3$-$10^4$ cm$^{-1}$ in the ultraviolet to infrared range. Quantum confinement effects can be exploited to increase the absorption coefficients of Si and Ge in a controllable fashion as discussed previously.

Also, Group IV semiconductor materials, such as Si and Ge, are desirable, since these materials typically have relatively low charge carrier recombination rates. In particular, recombination times of Si and Ge in bulk form can be in the microsecond or millisecond range. In contrast, recombination times of direct bandgap materials can be in the nanosecond range or less. Quantum confinement effects can be exploited to increase the recombination times of Si and Ge in a controllable fashion as discussed previously. The relatively long recombination times of Si and Ge can serve to mitigate charge carrier recombination at surfaces or boundaries of a set of nano-networks forming a nanostructured material. In particular, while the boundaries of the nano-networks can provide a large area for charge separation, these boundaries can also provide a large area that enhances charge carrier recombination. Advantageously, the relatively long recombination times of Si and Ge allow charge carriers to be transported across the nanostructured material and to reach electrodes before recombining.

In addition, Group IV semiconductor materials, such as Si and Ge, are desirable, since these materials typically have the ability to form covalent bonds with a number of materials. In particular, both Si and Ge have the ability to form strong and robust covalent bonds, such as Si—C bonds and Ge—C bonds. The ability to form covalent bonds allows functionalization of surfaces of nanoparticles or nano-networks with a broad class of materials, including organic materials and inorganic materials. In turn, this allows a broad selection of surface ligands that can be used to engineer properties of the resulting nanostructured material. The ability to form covalent bonds also allows functionalization of the surfaces of the nanoparticles or the nano-networks to be more robust as compared with other types of bonds, such as hydrogen bonds, van der Waals bonds, or those having an ionic character.

According to some embodiments of the invention, nanostructured materials can be formed using Si nanoparticles or Ge nanoparticles that are surface passivated or terminated with shells, such as shells formed from oxides of Si or Ge, or with surface ligands. For example, a Si nanoparticle can be substantially defect free and can have a size between about 1 nm and about 100 nm, such as between about 1 nm and about 20 nm or between about 1 nm and about 10 nm. Similarly, a Ge nanoparticle can be substantially defect free and can have a size between about 1 nm and about 100 nm, such as between about 1 nm and about 50 nm or between about 1 nm and about 20 nm. Use of Si nanoparticles or Ge nanoparticles that are substantially defect free can be particularly desirable, since defects can serve as recombination sites or trapping sites for photoexcited charge carriers. Desirably, a Si nanoparticle includes a substantially crystalline Si core, while a Ge nanoparticle includes a substantially crystalline Ge core. In the case of a shell surrounding a Si core or a Ge core, the shell typically has a thickness between about 0.1 nm and about 5 nm. Examples of the shell include $SiO_n$ for Si nanoparticles and $GeO_n$ for Ge nanoparticles, with n ranging between about 0 and about 2, such between about 1.5 and about 2 or between about 1.8 and about 2. The chemical composition of the shell can be varying continuously through a portion of the shell and optionally varying discontinuously through a portion of the shell, in which case n can represent an averaged value within the shell. In the case of surface ligands surrounding a Si core or a Ge core, the surface ligands can include organic molecules with a structure R. R can be any of a number of hydrophobic, hydrophilic, or amphiphilic organic molecules. The surface ligands can provide a surface coverage between about 0% and about 100%, such as between about 20% and about 100%, between about 50% and about 100%, or between about 80% and about 100%. The surface ligands can optionally include different types of organic molecules or can include molecules that interact indirectly with the surface of a Si core or a Ge core through other molecules interacting directly with the surface.

Methods for forming Si nanoparticles and Ge nanoparticles in accordance with some embodiments of the invention include a "top down" approach in which a bulk material is converted to the nanoparticles and a "bottom up" approach in which the nanoparticles are formed from chemical precursors. Additional discussion regarding the "top down" approach and the "bottom up" approach can be found, for example, in the patent of Lee et al., U.S. Pat. No. 6,794,265, entitled "Methods of Forming Quantum Dots of Group IV Semiconductor Materials" and issued on Sep. 21, 2004; the disclosure of which is incorporated herein by reference in its entirety.

Figure 5:
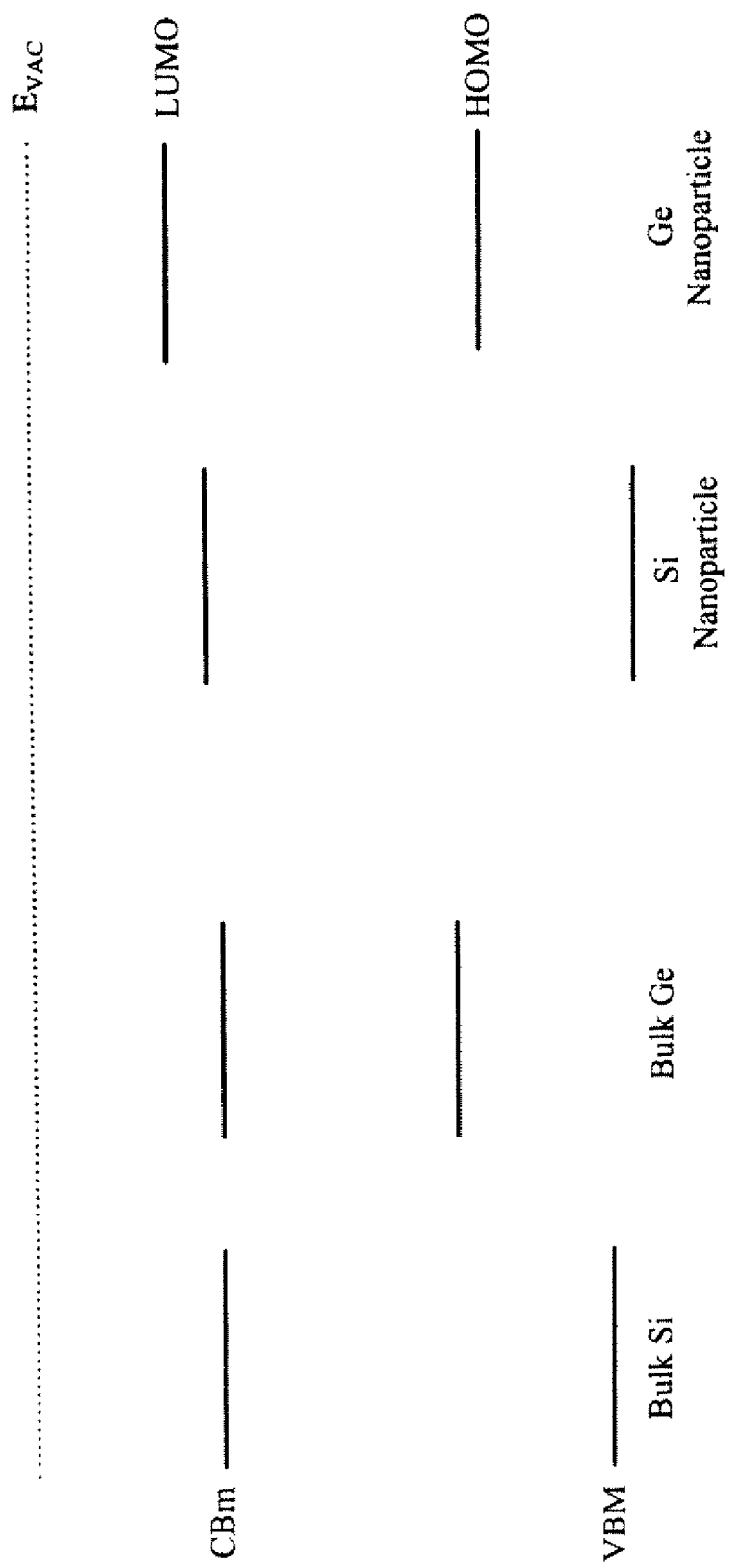
FIG. 5 illustrates band offsets that can occur between Si nanoparticles and Ge nanoparticles formed according to an embodiment of the invention.

By way of example, a nanostructured material can be formed using a combination of Si nanoparticles and Ge nanoparticles. The combination of Si nanoparticles and Ge nanoparticles can be desirable because of their favorable band offsets. FIG. 5 illustrates band offsets that can occur between Si nanoparticles and Ge nanoparticles formed according to an embodiment of the invention. By way of reference, FIG. 5 also illustrates band offsets that can occur between bulk Si and bulk Ge. Typically, differences in ionization potentials between the Si nanoparticles and the Ge nanoparticles result in holes preferentially separating into the Ge nanoparticles. Electron affinities of bulk Si and bulk Ge can be similar. However, quantum confinement effects can be exploited to provide differences in electron affinities between the Si nanoparticles and the Ge nanoparticles. Weakly quantum-confined Si nanoparticles, such as large Si quantum dots, used in combination with moderately quantum-confined Ge nanoparticles, such as moderately sized Ge quantum dots, can provide a nanostructured material in which the Si nanoparticles have a larger electron affinity and a larger ionization potential than the Ge nanoparticles. As a result, electrons can preferentially separate into and be transported in a nano-network formed from the Si nanoparticles, while holes can preferentially separate into and be transported in a nano-network formed from the Ge nanoparticles.

As another example, a nanostructured material can be formed using a combination of doped Si nanoparticles and doped Ge nanoparticles. Also, a nanostructured material can be formed by doping a nano-network formed from Si nanoparticles and doping a nano-network formed from Ge nanoparticles. In this case, electrons can preferentially separate into and be transported in a n-type nano-network, while holes can preferentially separate into and be transported in a p-type nano-network. A combination of doped and undoped materials can also be used, such as a doped nano-network formed from Si nanoparticles in combination with an undoped nano-network formed from Ge nanoparticles.

Figure 6:
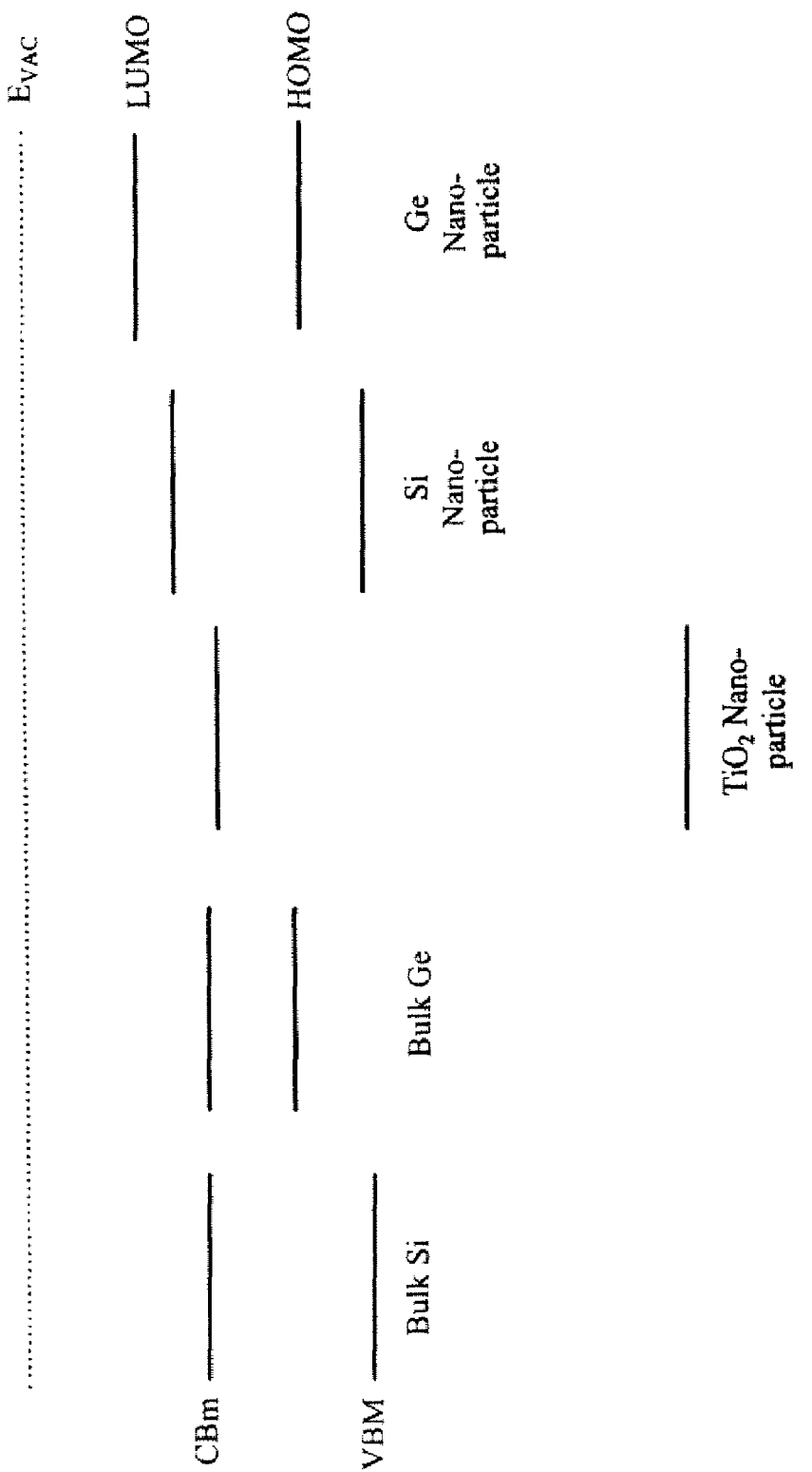
FIG. 6 illustrates band offsets that can occur between $TiO_2$ nanoparticles, Si nanoparticles, and Ge nanoparticles formed according to an embodiment of the invention.

As another example, a nanostructured material can be formed using a combination of titania or $TiO_2$ nanoparticles and either of, or both, Si nanoparticles and Ge nanoparticles. These nanoparticles can be fused or interconnected to form interdispersed, interpenetrating, fused, interconnected, or layered nano-networks. The combination of $TiO_2$ nanoparticles and either of, or both, Si nanoparticles and Ge nanoparticles can be desirable because of their favorable band offsets. FIG. 6 illustrates band offsets that can occur between $TiO_2$ nanoparticles, Si nanoparticles, and Ge nanoparticles formed according to an embodiment of the invention. By way of reference, FIG. 6 also illustrates band offsets that can occur between the $TiO_2$ nanoparticles, bulk Si, and bulk Ge. Typically, the $TiO_2$ nanoparticles have a larger electron affinity and a larger ionization potential than the Si nanoparticles and the Ge nanoparticles. As a result, electrons can preferentially separate into and be transported in a nano-network formed from the $TiO_2$ nanoparticles, while holes can preferentially separate into and be transported in a nano-network formed from either of the Si nanoparticles and the Ge nanoparticles. The combination of the $TiO_2$ nanoparticles and either of, or both, the Si nanoparticles and the Ge nanoparticles can also be desirable to exploit the ability of the $TiO_2$ nanoparticles to transport electrons effectively. It is also contemplated that nanoparticles formed from other metal oxides, such as $WO_3$, ZnO, SnO, $SnO_2$, and NiO, can be used in place of, or in combination with, the $TiO_2$ nanoparticles.

As further examples, a nanostructured material can be formed using a combination of nanoporous Si or nanoporous Ge and either of, or both, Si nanoparticles and Ge nanoparticles, a combination of ZnSe and either of, or both, Si nanoparticles and Ge nanoparticles, a combination of GaAs and either of, or both, Si nanoparticles and Ge nanoparticles, or a combination of a matrix and either of, or both, Si nanoparticles and Ge nanoparticles.

Percolation Limit

As discussed previously, at least a portion of a nanostructured material in the Percolation Limit has a non-contiguous configuration. In some instances, at least a subset of nanoparticles that form the nanostructured material are discrete, are not fused or interconnected, or are fused or interconnected to a low degree. For example, the nanostructured material can include a set of nanoparticles that are dispersed at some concentration or number density in a matrix. The set of nanoparticles can include one or more types of nanoparticles. The matrix can be macroscopic, microscopic, or nanoscopic in nature. Examples of a macroscopic matrix include bulk polymers, such as bulk organic and inorganic polymers, or bulk semiconductor materials. Examples of a microscopic or nanoscopic matrix include small molecules, such as small organic and inorganic molecules, oligomers, such as organic and inorganic oligomers, polymer backbones, such as organic and inorganic polymer backbones, nanoparticles, and surface ligands bound to nanoparticles. The nanostructured material can be formed as a film of a single material, such as a single component film, or as a film of multiple materials, such as a multi-component film.

Charge separation can occur at or near boundaries between nanoparticles and a matrix, such that a particular type of charge carrier can preferentially separate into and be transported in either the nanoparticles or the matrix. In some instances, electrons can preferentially separate into and be transported in the nanoparticles, while holes can preferentially separate into and be transported in the matrix. In other instances, electrons can preferentially separate into and be transported in the matrix, while holes can preferentially separate into and be transported in the nanoparticles. To provide effective charge separation and charge carrier transport, the nanoparticles and the matrix can be selected based on a number of properties, such as electron affinity, ionization potential, charge carrier mobility, and resistivity. For example, the nanoparticles and the matrix can be selected based on differences in electron affinities and ionization potentials, such that electrons can preferentially separate into and be transported in a component with the largest electron affinity, while holes can preferentially separate into and be transported in a component with the lowest ionization potential. Due to the discrete configuration of the nanoparticles in the matrix, a relatively high concentration or number density of the nanoparticles is desirable to reach a percolation threshold, which allows effective charge carrier transport. Typically, charge carrier transport in the Percolation Limit occurs via a hopping or tunneling mechanism from one nanoparticle to another nanoparticle. In the case the matrix has a microscopic or nanoscopic nature, charge carrier transport in the matrix can also occur via a hopping or tunneling mechanism from one component of the matrix to another component of the matrix. Accordingly, a relatively high concentration or number density of the components of the matrix is desirable to reach a percolation threshold.

Nanostructured materials at or near the Percolation Limit can be formed using a number of methods, such as:
1. Dispersing nanoparticles as a solute in a matrix, such that the nanoparticles transport one type of charge carrier, and the matrix transports a complementary type of charge carrier;
2. Connecting nanoparticles via surface ligands to a matrix:
   a. The nanoparticles can be optionally dispersed as a solute in the matrix;
3. Mixing different types of nanoparticles together, such that one type of nanoparticle serves a solute, while another type of nanoparticle serves as a nanoscopic matrix:
   a. Any number of types of nanoparticles can be mixed together;
   b. At least a subset of the nanoparticles can be fused or interconnected to some degree:
      i. A subset of the nanoparticles are fused or interconnected to some degree;

ii. A subset of the nanoparticles are not fused or interconnected; and
iii. Combinations of the above;
4. Connecting nanoparticles to a polymer backbone, which serves as a nanoscopic matrix;
5. Connecting nanoparticles to one another via surface ligands, which serve as a nanoscopic matrix; and
6. Forming solids of nanoparticles, such as quantum dot solids and quantum dot superlattices.

Figure 7:
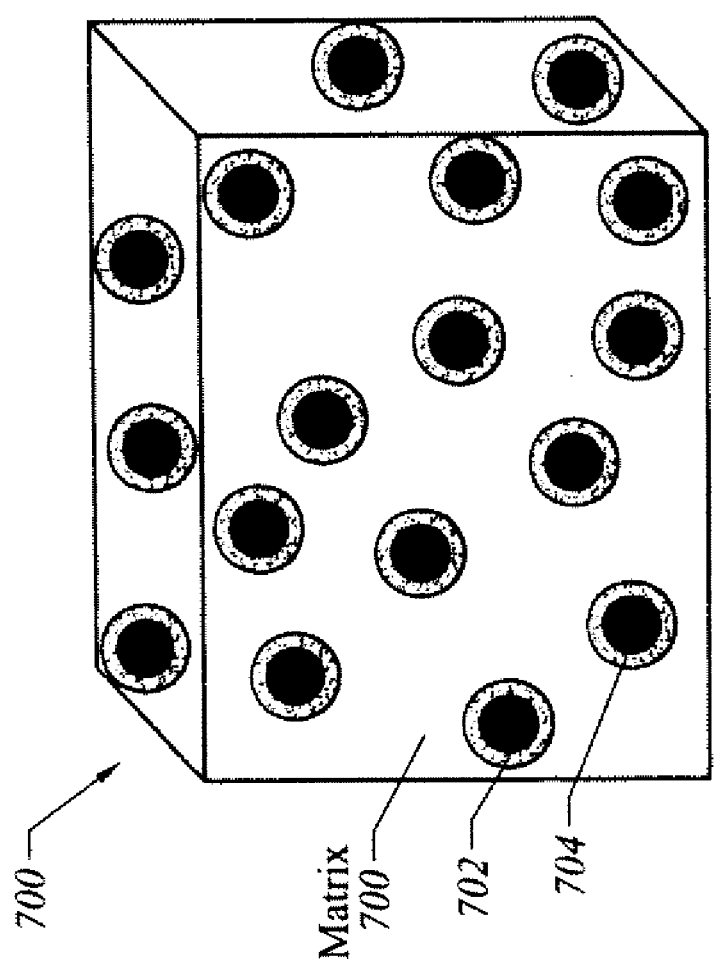
FIG. 7 illustrates a nanostructured material formed by dispersing nanoparticles as a solute in a matrix, according to an embodiment of the invention.

For example, as illustrated in FIG. 7, a nanostructured material 700 can be formed by dispersing nanoparticles, such as nanoparticles 702 and 704, as a solute in a matrix 706. To provide effective charge separation, the nanoparticles and the matrix 706 can be selected based on differences in HOMO and LUMO energy levels, differences in electron affinities and ionization potentials, or differences in doping. Examples of a material that can form the matrix 706 include:

1. Inorganic materials, such as doped or undoped inorganic semiconductor materials, inorganic polymers, inorganic oligomers, and inorganic molecules, such as Donor/Acceptor ("D/A") inorganic molecules;
2. Organic materials, such as doped or undoped organic semiconductor materials, organic polymers, organic oligomers, and organic molecules, such as D/A organic molecules;
3. Metals;
4. Metal Oxides, such as doped or undoped metal oxides;
5. Dielectric materials;
6. Glasses;
7. Ceramics; and
8. Combinations of the above.

Surface ligands can be bound, either covalently or non-covalently, to surfaces of nanoparticles to perform a number of functions. One function that can be performed by the surface ligands is to improve solubility of the nanoparticles in a matrix. By appropriately selecting the surface ligands to have similar properties as the matrix, the solubility of the nanoparticles can be increased, thus allowing a higher concentration or number density of the nanoparticles in the matrix. Another function that can be performed by the surface ligands is to assist separation of charge carriers at or near boundaries between the nanoparticles and the matrix. The charge carriers can be initially produced in the nanoparticles or in the matrix. By appropriately selecting the surface ligands based on properties such as chemical, electronic, and physical properties, junctions can be formed at or near interface regions between surfaces of the nanoparticles and the surface ligands to facilitate charge separation. Such junctions can correspond to, for example, p-n junctions or D/A interfaces. In addition to forming junctions, the surface ligands can also serve as intermediate regions between the nanoparticles and the matrix to spatially separate charge carriers, thus reducing or preventing their recombination. For example, the surface ligands can facilitate charge separation by transporting one type of charge carrier spatially away from the nanoparticle into the matrix. As another example, the surface ligands can facilitate charge separation by transporting another type of charge carrier spatially away from the matrix into the nanoparticles. Similarly, shells of the nanoparticles can be selected to perform the various functions discussed above.

As another example, a nanostructured material can be formed as a film that includes different types of nanoparticles, and the different types of nanoparticles can form respective nano-networks in the film. To provide effective charge separation and charge carrier transport, the different types of nanoparticles can be selected based on differences in HOMO and LUMO energy levels, differences in electron affinities and ionization potentials, or differences in doping, such that complementary types of charge carriers preferentially separate into and are transported in respective nano-networks.

As another example, different types of nanoparticles can be mixed together, such that one type of nanoparticle serves as a solute, while another type of nanoparticle serves as a nanoscopic matrix. To provide effective charge separation and charge carrier transport, the different types of nanoparticles can be selected based on differences in HOMO and LUMO energy levels, differences in electron affinities and ionization potentials, or differences in doping. In some instances, the resulting mixture can treated by, for example, heat sintering or cold sintering, such that nanoparticles serving as the nanoscopic matrix substantially fuse to full density, while nanoparticles serving as the solute are not fused or are fused to a low degree.

As another example, nanoparticles can be interconnected through chemical bonding between the nanoparticles, through chemical bonding between surface ligands bound to the nanoparticles, through electrochemical interactions between the nanoparticles or the surface ligands bound to the nanoparticles, through D/A interactions between the nanoparticles or the surface ligands bound to the nanoparticles, through various types of electric or magnetic fields, or a combination thereof. In particular, nanoparticles can be interconnected to one another via surface ligands or via a polymer backbone. In some instances, the nanoparticles can be connected to the polymer backbone via surface ligands. One type of charge carrier can be transported via the surface ligands or via the polymer backbone, while a complementary type of charge carrier can be transported via a hopping or tunneling mechanism from one nanoparticle to another nanoparticle. However, it is contemplated that charge carrier transport for both types of charge carriers can occur via the surface ligands or via the polymer backbone, thus allowing effective charge carrier transport without relying on less effective transport mechanisms, such as a hopping or tunneling mechanism. Certain properties of the surface ligands or the polymer backbone, such as length and degree of conjugation, can affect charge separation and charge carrier transport. Accordingly, charge separation and charge carrier transport can be enhanced by appropriate selection of the surface ligands or the polymer backbone based on chemical, electronic, and physical properties. For example, charge transfer molecular species, D/A molecular species, or conjugated molecular species can be selected as the surface ligands, or a conducting polymer can be selected as the polymer backbone.

As a further example, layers of differently sized nanoparticles can be successively formed with or without a matrix. In particular, one layer can be formed from nanoparticles of a particular size, while another layer can be formed from nanoparticles of a different size. In such manner, different portions of an incident light spectrum can be absorbed in different layers as light energy penetrates the resulting film. In some instances, the layers can be formed, such that incident light energy first reaches a layer formed from the highest energy absorbing nanoparticles (e.g., nanoparticles with smallest size), followed by layers formed from successively lower energy absorbing nanoparticles (e.g., nanoparticles with successively larger sizes). In such manner, each layer primarily absorbs a portion of the incident light spectrum with energies near its bandgap energy, thus reducing above bandgap absorption and its associated inefficiencies in terms of conversion of the incident light energy to useful electrical energy (e.g., hot charge carrier relaxation).

Contiguous Limit

As discussed previously, a nanostructured material in the Contiguous Limit has a contiguous configuration. Advantageously, the contiguous configuration of the nanostructured material provides contiguous conductive paths between electrodes, which allow effective charge carrier transport without relying on less effective transport mechanisms, such as a hopping or tunneling mechanism. In particular, the contiguous conductive paths can allow band-like electrical conduction to occur. In some instances, the nanostructured material includes at least one nano-network, and a set of nanoparticles that form the nano-network are fused or interconnected to at least some degree. The nano-network can be interdispersed, interpenetrating, fused, interconnected, or layered with any number of other nano-networks. In other instances, the nanostructured material includes at least one nano-network, and a set of nanoparticles that form the nano-network are spatially extended. The nano-network can be interdispersed, interpenetrating, fused, interconnected, or layered with any number of other nano-networks.

Nanostructured materials at or near the Contiguous Limit can be formed using a number of methods, such as:
1. Fusing or interconnecting one type of nanoparticle, such as Si nanoparticles or Ge nanoparticles, to form a nano-network and optionally interdispersing the nano-network with a matrix;
2. Fusing or interconnecting two types of nanoparticles, such as Si nanoparticles and Ge nanoparticles:
   a. Forming one nano-network from Si nanoparticles and another nano-network from Ge nanoparticles and optionally interdispersing the nano-networks with a matrix;
   b. Forming a mixed nano-network from Si nanoparticles and Ge nanoparticles and optionally interdispersing the nano-network with a matrix; and
   c. Forming a mixed nano-network from alloys, such as $Si_xGe_y$, and optionally interdispersing the nano-network with a matrix;
3. Fusing or interconnecting two types of nanoparticles, such as $TiO_2$ nanoparticles and either Si nanoparticles or Ge nanoparticles:
   a. Forming one nano-network from $TiO_2$ nanoparticles and another nano-network from either Si nanoparticles or Ge nanoparticles and optionally interdispersing the nano-networks with a matrix;
   b. Forming a mixed nano-network from $TiO_2$ nanoparticles and either Si nanoparticles or Ge nanoparticles and optionally interdispersing the nano-network with a matrix; and
   c. Forming a mixed nano-network from alloys and optionally interdispersing the nano-network with a matrix; and
4. Fusing or interconnecting three or more types of nanoparticles, such as $TiO_2$ nanoparticles, Si nanoparticles, and Ge nanoparticles, to form a set of nano-networks and optionally interdispersing the set of nano-networks with a matrix.

For example, a nanostructured material can be formed from nanoparticles that are initially not fused or interconnected. In some instances, the nanoparticles have properties that can be engineered by exploiting quantum confinement effects. Advantageously, the resulting nanostructured material can have a number of desirable properties, including, for example, effective light absorption, effective charge separation, reduced charge carrier recombination and trapping, and effective charge carrier transport. The nanostructured material can be formed by fusing or interconnecting the nanoparticles to form a set of nano-networks. The degree of fusion or interconnection can vary over a wide range, such as from little or no fusion or interconnection to complete fusion or interconnection. Advantageously, the degree of fusion or interconnection can be controlled for a particular application and can determine certain properties of the nanostructured material, including, for example, chemical, optical, electronic, and physical properties. The nanostructured material can be formed as a film of a single material, such as a single component film, or as a film of multiple materials, such as a multi-component film. In the case of a multi-component film, nano-networks formed from different materials can be interdispersed, interpenetrating, fused, interconnected, or layered with one another. To provide effective charge separation and charge carrier transport, the different materials can be selected based on differences in HOMO and LUMO energy levels, differences in electron affinities and ionization potentials, or differences in doping, such that complementary types of charge carriers preferentially separate into and are transported in respective nano-networks.

Nanoparticles can be fused or interconnected using a number of methods. For example, nanoparticles can be fused by applying energy to the nanoparticles. Forms of energy that can be applied include, for example: thermal energy, such as via heat sintering; mechanical energy, such as via cold sintering or pressure; electrical energy; electromagnetic energy, such as in the form of light waves, radio waves, or microwaves; magnetic energy; vibrational energy, such as in the form of sonic or ultrasonic waves; surface energy, such as based on surface tension or capillary forces; and combinations thereof. The degree of fusion can be controlled based on a number of parameters, such as the form of energy that is applied, number of energy sources, magnitude of energy that is applied, manner in which energy is applied, and duration for which energy is applied.

In the case of a single component film, nanoparticles formed from the same material can fuse under different conditions. For example, in the case of heat sintering, nanoparticles formed from the same material but having different sizes can fuse at different temperatures (or different sintering durations). Nanoparticles that fuse at the highest temperature (or longest sintering duration) can be initially deposited on a substrate and heat sintered to form a porous structure. Nanoparticles that fuse at successively lower temperatures (or shorter sintering durations) can be successively deposited on or into the porous structure, such that the subsequently deposited nanoparticles can permeate the porous structure. In some instances, the subsequently deposited nanoparticles can be provided in a colloidal form to facilitate permeation into the porous structure, and any solvent that is present can be removed by, for example, heating. The porous structure permeated with the subsequently deposited nanoparticles can be heat sintered to fuse the subsequently deposited nanoparticles to one another within the porous structure. Heat sintering can also fuse the subsequently deposited nanoparticles to the porous structure. For certain applications, heat sintering can be performed, such that the subsequently deposited nanoparticles are fused completely to "full density" within the porous structure. In particular, the subsequently deposited nanoparticles can be fully melted within the porous structure. The resulting nanostructured material includes a nano-network corresponding to the porous structure that is interdispersed with a matrix corresponding to the nanoparticles that are fully melted. Advantageously, the matrix can provide contiguous conductive paths that allow effective charge carrier transport.

In the case of a multi-component film, different materials forming the film can fuse under different conditions. For example, in the case of heat sintering, nanoparticles formed from different materials can fuse at different temperatures (or different sintering durations). In a similar manner as discussed previously in connection with a single component film, nanoparticles that fuse at the highest temperature (or longest sintering duration) can be initially deposited on a substrate and heat sintered to form a porous structure. Nanoparticles that fuse at successively lower temperatures (or shorter sintering durations) can be successively deposited on or into the porous structure, such that the subsequently deposited nanoparticles can permeate the porous structure. The porous structure permeated with the subsequently deposited nanoparticles can be heat sintered to fuse the subsequently deposited nanoparticles to one another within the porous structure. Heat sintering can also fuse the subsequently deposited nanoparticles to the porous structure. For certain applications, heat sintering can be performed, such that the subsequently deposited nanoparticles are fused completely to "full density" within the porous structure.

In the process of forming a multi-component film, different materials forming the film can fuse to form a mixed nano-network. For example, Si nanoparticles and Ge nanoparticles can be mixed and fused to form a mixed nano-network of alloys, such as $Si_xGe_y$. Alloys can also be formed at boundaries between nano-networks. Fusing of different materials can serve to obtain desirable properties for the resulting mixed nano-network and the resulting multi-component film.

For certain applications, a matrix, such as an organic material, can be deposited on or into a porous structure formed from fused nanoparticles, such that the matrix can permeate the porous structure. In some instances, the matrix can be dissolved in a solvent to facilitate permeation into the porous structure, and any solvent that is present can be removed by, for example, heating. The resulting nanostructured material includes a nano-network corresponding to the porous structure that is interdispersed with the matrix. To provide effective charge separation and charge carrier transport, the matrix can be selected, such that one type of charge carrier preferentially separate into and is transported in the nano-network, while another type of charge carrier preferentially separate into and is transported in the matrix. Advantageously, the matrix can provide contiguous conductive paths that allow effective charge carrier transport.

Nanoparticles can be interconnected through chemical bonding between the nanoparticles, through chemical bonding between surface ligands bound to the nanoparticles, through electrochemical interactions between the nanoparticles or the surface ligands bound to the nanoparticles, through D/A interactions between the nanoparticles or the surface ligands bound to the nanoparticles, through various types of electric or magnetic fields, and combinations thereof. In particular, nanoparticles can be interconnected to one another via surface ligands or via a polymer backbone. In some instances, the nanoparticles can be connected to the polymer backbone via surface ligands. Charge carrier transport for complementary types of charge carriers can occur via the surface ligands or via the polymer backbone, thus allowing effective charge carrier transport without relying on less effective transport mechanisms, such as a hopping or tunneling mechanism. Certain properties of the surface ligands or the polymer backbone, such as length and degree of conjugation, can affect charge separation and charge carrier transport. Thus, charge separation and charge carrier transport can be enhanced by appropriate selection of the surface ligands or the polymer backbone based on their chemical, electronic, and physical properties. For example, charge transfer molecular species, D/A molecular species, or conjugated molecular species can be selected as the surface ligands, or a conducting polymer can be selected as the polymer backbone. As another example, the surface ligands can be selected to assist separation of charge carriers at or near surfaces of the nanoparticles. By appropriately selecting the surface ligands based on properties such as chemical, electronic, and physical properties, junctions can be formed at or near interface regions between surfaces of the nanoparticles and the surface ligands to facilitate charge separation. Such junctions can correspond to, for example, p-n junctions or D/A interfaces. In addition to forming junctions, the surface ligands can also serve as intermediate regions to spatially separate charge carriers, thus reducing or preventing their recombination.

As another example, a nanostructured material can be formed from a porous structure that is spatially extended. Advantageously, such porous structure provides contiguous conductive paths, which allow effective charge carrier transport without having to fuse or interconnect nanoparticles. Examples of such porous structure include those formed from nanoporous semiconductor materials, such as nanoporous Si and nanoporous Ge. In a similar manner as discussed previously in connection with a single component film and a multi-component film, nanoparticles that fuse at successively lower temperatures (or shorter sintering durations) can be successively deposited on or into the porous structure, such that the subsequently deposited nanoparticles can permeate the porous structure. Alternatively, or in conjunction, a matrix, such as an organic material, can be deposited on or into the porous structure, such that the matrix can permeate the porous structure. For example, nanoporous Si can be formed using any of a number of conventional methods. The nanoporous Si can be formed as a film on a Si wafer. A colloidal suspension of Ge nanoparticles can be provided to permeate pores or vacuoles of the nanoporous Si by, for example, spinning or spraying the colloidal suspension onto the nanoporous Si or by dipping or soaking the nanoporous Si into the colloidal suspension. Any solvent that is present can be removed by, for example, heating. Next, the Ge nanoparticles can be fused or interconnected within the nanoporous Si by, for example, heat sintering or by interconnecting the Ge nanoparticles via surface ligands.

As another example, a nanostructured material can be formed using a "sacrificial" template. In particular, a nanostructured material can be formed using a "sacrificial" porous structure that serves as the "sacrificial" template. In some instances, the "sacrificial" porous structure can be formed by fusing a "sacrificial" set of nanoparticles. In a similar manner as discussed previously in connection with a single component film and a multi-component film, nanoparticles can be successively deposited on or into the "sacrificial" porous structure, such that the subsequently deposited nanoparticles can permeate the "sacrificial" porous structure. The subsequently deposited nanoparticles can then be fused or interconnected within the "sacrificial" porous structure. The "sacrificial" porous structure can be removed by, for example, applying energy or via chemical or mechanical means.

As another example, a nanostructured material can be formed from nanoparticles that are spatially extended. Advantageously, such nanoparticles provide contiguous conductive paths, which allow effective charge carrier transport without having to fuse or interconnect the nanoparticles. For example, the nanostructured material can include a nano-network that is formed as an array of nanorods, nanocolumns, nanotubes, or quantum wires that are substantially aligned in a direction for effective charge carrier transport. This direction is typically perpendicular to a substrate on which the nanoparticles are deposited. The nanostructured material can be formed as a film of a single material, such as a single component film, or as a film of multiple materials, such as a multi-component film. In the case of a multi-component film, nano-networks formed from different materials can be inter-dispersed, interpenetrating, fused, interconnected, or layered with one another. To provide effective charge separation and charge carrier transport, the different materials can be selected based on differences in HOMO and LUMO energy levels, differences in electron affinities and ionization potentials, or differences in doping, such that complementary types of charge carriers preferentially separate into and are transported in respective nano-networks. In a similar manner as discussed previously, nanoparticles that fuse at successively lower temperatures (or shorter sintering durations) can be successively deposited on or into a nano-network formed from nanoparticles that are spatially extended, such that the subsequently deposited nanoparticles can permeate the nano-network. In some instances, the subsequently deposited nanoparticles are also spatially extended. Alternatively, or in conjunction, a matrix, such as an organic material, can be deposited on or into the nano-network, such that the matrix can permeate the nano-network.

As a further example, layers of differently sized nanoparticles can be successively formed with or without a matrix. In particular, one layer can be formed by fusing or interconnecting nanoparticles of a particular size, while another layer can be formed by fusing or interconnecting nanoparticles of a different size. Successive layers of the resulting film can be fused or interconnected with one another. In some instances, the layers can be formed, such that incident light energy first reaches a layer formed from the highest energy absorbing nanoparticles (e.g., nanoparticles with smallest size), followed by layers formed from successively lower energy absorbing nanoparticles (e.g., nanoparticles with successively larger sizes). In such manner, different portions of an incident light spectrum can be absorbed in different layers as light energy penetrates the resulting film. Also, each layer can primarily absorb a portion of the incident light spectrum with energies near its bandgap energy, thus reducing above bandgap absorption and its associated inefficiencies in terms of conversion of the incident light energy to useful electrical energy (e.g., hot charge carrier relaxation).

Photovoltaic Devices

Certain embodiments of the invention relate to optoelectronic devices, such as photovoltaic devices, formed using nanostructured materials discussed herein. Advantageously, the configuration of the nanostructured materials can be engineered to promote a number of desirable properties, which, in the case of photovoltaic devices, include, for example, effective light absorption, effective charge separation, reduced charge carrier recombination and trapping, and effective charge carrier transport and collection. As one of ordinary skill in the art will understand, one measure of the conversion efficiency of a photovoltaic device is a short circuit current density. Advantageously, photovoltaic devices according to some embodiments of the invention can provide a short circuit current density that is greater than about 20 mA/cm$^2$, such as from about 20 mA/cm$^2$ to about 100 mA/cm$^2$; at least about 25 mA/cm$^2$, such as from about 25 mA/cm$^2$ to about 100 mA/cm$^2$; at least about 30 mA/cm$^2$, such as from about 30 mA/cm$^2$ to about 100 mA/cm$^2$; at least about 40 mA/cm$^2$, such as from about 40 mA/cm$^2$ to about 100 mA/cm$^2$; at least about 50 mA/cm$^2$, such as from about 50 mA/cm$^2$ to about 100 mA/cm$^2$; or at least about 60 mA/cm$^2$, such as from about 60 mA/cm$^2$ to about 100 mA/cm$^2$.

Photovoltaic devices according to various embodiments of the invention can be formed in a number of configurations, such as:
1. Metal-Insulator-Metal ("MIM");
2. Metal-Semiconductor-Metal ("MSM");
3. P-type Semiconductor-Insulator-N-type Semiconductor ("PIN");
4. P-type Semiconductor-Semiconductor-N-type Semiconductor ("PSN");
5. Metal-Insulator-N-type Semiconductor ("MIN");
6. Metal-Semiconductor-N-type Semiconductor ("MSN");
7. P-type Semiconductor-Insulator-Metal ("PIM"); and
8. P-type Semiconductor-Semiconductor-Metal ("PSM").

A nanostructured material can serve as the insulator or the semiconductor in the configurations set forth above.

Photovoltaic devices according to various embodiments of the invention can be formed as single component photovoltaic devices or multi-component photovoltaic devices. Single component photovoltaic devices include a nanostructured material that serves as a photoactive material and is formed as a single component film. An example of a single component photovoltaic device is one that includes a single component film formed from either Si nanoparticles or Ge nanoparticles. In the case of solar applications, a desirable level of efficiency can be obtained with a single component film having a bandgap energy between about 1.1 eV and about 1.6 eV, such as at or near 1.4 eV. Multi-component photovoltaic devices include a nanostructured material that serves as a photoactive material and is formed as a multi-component film. An example of a multi-component photovoltaic device is one that includes a multi-component film formed with heterojunctions or with multiple bandgap energies. By engineering the heterojunctions or the bandgap energies, the multi-component film can allow effective light absorption, such that a wider range of an incident light spectrum can be efficiently converted to useful electrical energy.

Figure 8:
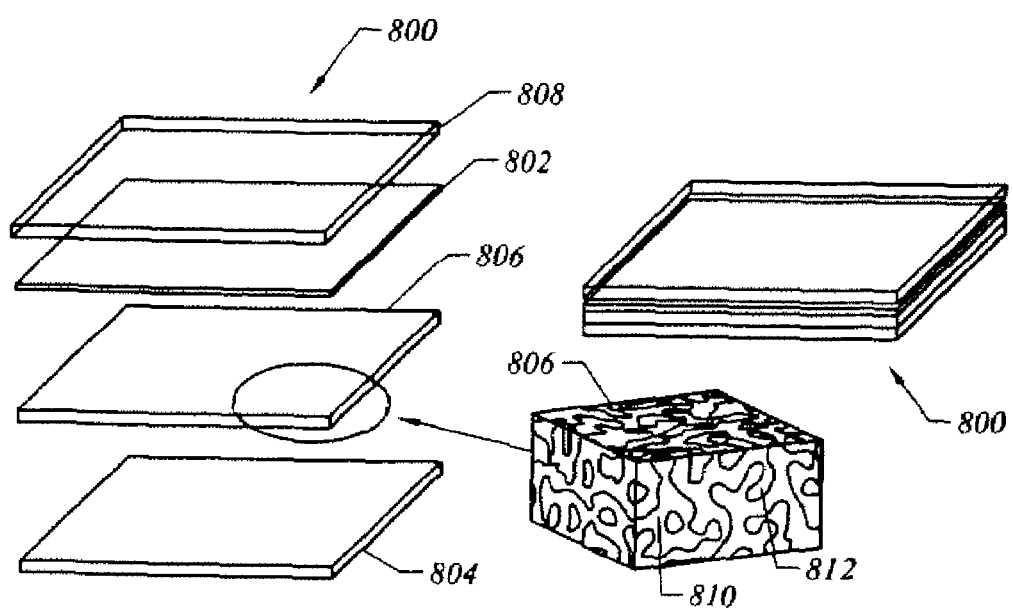
FIG. 8 illustrates a photovoltaic device according to an embodiment of the invention.

FIG. 8 illustrates a photovoltaic device 800 according to an embodiment of the invention. In particular, FIG. 8 illustrates an exploded, perspective view and an assembled, perspective view of the photovoltaic device 800. The photovoltaic device 800 includes a pair of electrodes 802 and 804 and a nanostructured material 806 positioned between the electrodes 802 and 804. In the illustrated embodiment, the photovoltaic device 800 also includes a cover 808, which is substantially transparent and serves to protect the various components of the photovoltaic device 800 during use.

In the illustrated embodiment, the electrode 802 is substantially transparent and is positioned above the nanostructured material 806 so as to face incident light energy, while the electrode 804 is positioned below the nanostructured material 806 and serves as a substrate. The electrodes 802 and 804 can be formed from the same material or different materials. Examples of materials that can be used to form the electrodes 802 and 804 include:
1. Inorganic materials with relatively high electrical conductivity, such as doped or undoped inorganic semiconductor materials, inorganic polymers, inorganic oligomers, and inorganic molecules;
2. Organic materials with relatively high electrical conductivity, such as doped or undoped organic semiconductor materials, organic polymers, organic oligomers, and organic molecules;
3. Metals;
4. Metal Oxides, such as doped or undoped metal oxides; and
5. Combinations of the above.

The nanostructured material 806 serves as a photoactive material and includes an electron-transporting nano-network 810 and a hole-transporting nano-network 812. In the illustrated embodiment, the electron-transporting nano-network 810 is formed from a set of fused or interconnected Si nanoparticles, while the hole-transporting nano-network 812 is formed from a set of fused or interconnected Ge nanoparticles. The degree of fusion or interconnection of the Si nanoparticles forming the electron-transporting nano-network 810 can vary over a wide range, such as from little or no fusion or interconnection to complete fusion or interconnection. Similarly, the degree of fusion or interconnection of the Ge nanoparticles forming the hole-transporting nano-network 812 can vary over a wide range, such as from little or no fusion or interconnection to complete fusion or interconnection.

Desirably, materials forming the electrodes 802 and 804 and the nanostructured material 806 are selected, such that Fermi levels of the electrodes 802 and 804 are appropriately aligned with respect to a LUMO energy level of the electron-transporting nano-network 810 and a HOMO energy level of the hole-transporting nano-network 812. In some instances, a Fermi level of a hole collecting electrode, such as the electrode 802, is substantially aligned with the HOMO energy level of the hole-transporting nano-network 812, and a Fermi level of an electron collecting electrode, such as the electrode 804, is substantially aligned with the LUMO energy level of the electron-transporting nano-network 810.

During operation of the photovoltaic device 800, incident light energy is absorbed by the nanostructured material 806 to produce charge carriers in the form of, for example, electron-hole pairs or excitons. Electrons are transported in the electron-transporting nano-network 810 and exit the nanostructured material 806 through the electrode 804, while holes are transported in the hole-transporting nano-network 812 and exit the nanostructured material 806 through the electrode 802. The net effect is a flow of an electric current through the photovoltaic device 800 driven by the incident light energy, which electric current can be delivered to an external load to perform useful work.

It should be recognized that the embodiments of the invention discussed above are provided by way of example, and various other embodiments are encompassed by the invention. For example, while some embodiments of the invention have been described with reference to photovoltaic devices, it is contemplated that the nanostructured materials described herein can be included in other optoelectronic devices, such as photoconductors, photodetectors, LEDs, lasers, and other devices that involve photons and charge carriers during their operation.

A practitioner of ordinary skill in the art requires no additional explanation in developing the nanostructured materials and the photovoltaic devices described herein but may nevertheless find some helpful guidance by examining the patent of Lee et al., U.S. Pat. No. 6,710,366, entitled "Nanocomposite Materials with Engineered Properties" and issued on Mar. 23, 2004; the patent of Lee et al., U.S. Pat. No. 6,794,265, entitled "Methods of Forming Quantum Dots of Group IV Semiconductor Materials" and issued on Sep. 21, 2004; and the patent of Lee et al., U.S. Pat. No. 6,819,845, entitled "Optical Devices with Engineered Nonlinear Nanocomposite Materials" and issued on Nov. 16, 2004; the disclosures of which are incorporated herein by reference in their entireties. A practitioner of ordinary skill in the art may also find some helpful guidance by examining the patent application of Lee, U.S. patent application Ser. No. 10/212,001 (U.S. Patent Application Publication No. 2003/0066998), entitled "Quantum Dots of Group IV Semiconductor Materials" and filed on Aug. 2, 2002; and the patent application of Lee et al., U.S. patent application Ser. No. 10/212,002, entitled "Quantum Dots, Nanocomposite Materials with Quantum Dots, Devices with Quantum Dots, and Related Fabrication Methods" and filed on Aug. 2, 2002; the disclosures of which are incorporated herein by reference in their entireties.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A nanostructured material, comprising:
   (a) a first nano-network formed from a plurality of Si quantum dots that are at least one of fused and interconnected; and
   (b) a second nano-network coupled to said first nano-network and formed from a plurality of Ge quantum dots that are at least one of fused and interconnected,
   said plurality of Si quantum dots having a first peak size that is from about 1 nm to about 20 nm, said plurality of Ge quantum dots having a second peak size that is greater than said first peak size to define a staggered band offset between said first nano-network and said second nano-network,
   said nanostructured material being configured to absorb light to produce a first type of charge carrier and a second type of charge carrier, said first type of charge carrier separating into said first nano-network in accordance with said staggered band offset and being-transported in said first nano-network, said second type of charge carrier separating into said second nano-network in accordance with said staggered band offset and being transported in said second nano-network, said nanostructured material having an absorption coefficient that is at least $10^3$ $cm^{-1}$ within a range of wavelengths from about 400 nm to about 700 nm.

2. The nanostructured material of claim 1, wherein said plurality of Si quantum dots are at least one of fused and interconnected to provide a contiguous conductive path for said first type of charge carrier through at least a portion of said first nano-network.

3. The nanostructured material of claim 2, wherein said plurality of Ge quantum dots are at least one of fused and interconnected to provide a contiguous conductive path for said second type of charge carrier through at least a portion of said second nano-network.

4. The nanostructured material of claim 1, wherein said plurality of Si quantum dots have said first peak size that is from about 1 nm to about 10 nm.

5. The nanostructured material of claim 1, wherein said first type of charge carrier corresponds to electrons, and said second type of charge carrier corresponds to holes.

6. The nanostructured material of claim 1, wherein said first type of charge carrier and said second type of charge carrier are separated at a boundary between said first nano-network and said second nano-network.

7. The nanostructured material of claim 1, wherein said absorption coefficient is at least $10^4$ cm$^{-1}$.

8. The nanostructured material of claim 7, wherein said absorption coefficient is at least $10^5$ cm$^{-1}$.

9. The nanostructured material of claim 1, wherein said nanostructured material has a charge carrier recombination time that is at least 1 ns.

10. The nanostructured material of claim 9, wherein said charge carrier recombination time is at least 10 ns.

11. The nanostructured material of claim 10, wherein said charge carrier recombination time is at least 100 ns.

12. The nanostructured material of claim 4, wherein said plurality of Si quantum dots are interconnected via a first plurality of surface ligands, and said plurality of Ge quantum dots are interconnected via a second plurality of surface ligands.

13. The nanostructured material of claim 12, wherein said first plurality of surface ligands and said second plurality of surface ligands are selected from charge transfer molecular species, Donor Acceptor molecular species, and conjugated molecular species.

* * * * *